United States Patent [19]
Kuroi et al.

[11] Patent Number: 5,801,425
[45] Date of Patent: Sep. 1, 1998

[54] SEMICONDUCTOR DEVICE HAVING A WIRING LAYER INCLUDING A TISI2, FILM OF THE C49 OR C54 STRUCTURE

[75] Inventors: Takashi Kuroi; Hidekazu Oda, both of Tokyo, Japan

[73] Assignee: Mitsubishi Denki Kabushiki Kaisha, Tokyo, Japan

[21] Appl. No.: 907,458

[22] Filed: Aug. 8, 1997

Related U.S. Application Data

[63] Continuation of Ser. No. 589,941, Jan. 23, 1996, abandoned.

[30] Foreign Application Priority Data

Jul. 6, 1995 [JP] Japan ..................................... 7-170969
Sep. 22, 1995 [JP] Japan ..................................... 7-244444

[51] Int. Cl.$^6$ .......................... H01L 29/76; H01L 29/47; H01L 29/12
[52] U.S. Cl. .................. 257/383; 257/369; 257/384; 257/385; 257/388; 257/486; 257/914
[58] Field of Search ....................... 257/369, 383, 257/384, 385, 388, 486, 914, 386

[56] References Cited

U.S. PATENT DOCUMENTS

| | | | |
|---|---|---|---|
| 5,027,185 | 6/1991 | Liauh | 257/384 |
| 5,146,309 | 9/1992 | Spinner et al. | 257/383 |
| 5,221,853 | 6/1993 | Joshi et al. | 257/383 |
| 5,514,902 | 5/1996 | Kawasaki et al. | 257/607 |
| 5,518,958 | 5/1996 | Giewont et al. | 437/186 |
| 5,550,079 | 8/1996 | Lin | 437/56 |

OTHER PUBLICATIONS

"W/WNx/Poly-Si Gate Technology for Future High Speed Deep Submicron CMOS LSIs," K. Kasai et al., Tech. Dig. IEDM 1994, pp. 497–500.

*Primary Examiner*—Valencia Wallace
*Attorney, Agent, or Firm*—McDermott, Will & Emery

[57] ABSTRACT

A gate electrode is made up of a polycrystalline silicon film containing phosphorous as a dopant for determining its conductivity type, a titanium silicide film of the C54 structure, and a tungsten silicide film all of which films are laid one on another in said order.

12 Claims, 18 Drawing Sheets

SEMICONDUCTOR DEVICE HAVING A WIRING LAYER INCLUDING A TISI2, FILM OF THE C49 OR C54 STRUCTURE

This application is a continuation of application Ser. No. 08/589,941 filed Jan. 23, 1996, now abandoned.

BACKGROUND OF THE INVENTION

1. Field of the Invention

This invention relates to a semiconductor device which can prevent a dopant contained in a non-single-crystal silicon film for determining its conductivity type from diffusing into a metal silicide film, and therefore has improved device characteristics. The invention also relates to a method for manufacturing such a semiconductor device.

2. Description of the Related Art

FIG. 17 is a cross sectional view showing the construction of a first conventional semiconductor device, which is an NMOS transistor. In the drawing, reference numeral 1 denotes a semiconductor substrate; 2, a device isolation oxide film formed on the semiconductor substrate 1; 3, source/drain regions formed in an active region surrounded by the device isolation oxide film 2 of the semiconductor substrate 1; 4, a gate oxide film formed on the semiconductor substrate 1; and 5, a gate electrode formed on the gate oxide film 4. The gate electrode 5 is made up of a polycrystalline silicon film 6 doped with a dopant, e.g., phosphorous, for determining its conductivity type, a titanium silicide film 7, and a tungsten silicide film which are stacked in the above order.

A method of manufacturing the NMOS transistor of the first prior art having the above-described construction will now be described in conjunction with FIGS. 18A and 18B. To begin with, the device isolation oxide film 2 is formed on the semiconductor substrate 1 by the LOCOS method. Next, the gate oxide film 4 having a thickness of 60 Å is formed by oxidizing the top surface of the semiconductor substrate 1 by, for example, thermal oxidation. Then, a polycrystalline silicon film 6 that is doped with phosphorous at a dose of $5\times10^{20}/cm^2$ as a dopant for determining its conductivity type is formed at a thickness of, for example, 800 Å by CVD. A titanium silicide film 7 is then formed on the polycrystalline film 6 at a thickness of, for example, 150 Å by sputtering. This is followed by formation of a tungsten silicide film 8 at a thickness of, for example, 800 Å by sputtering (FIG. 18A).

Thereafter, the gate electrode 5 is formed by etching a desired area of the tungsten silicide film 8, the titanium silicide film 7, and the polycrystalline silicon film 6 by use of a photolithography technique (FIG. 18B). LDD layers are then formed by implanting, e.g., arsenic ions into the semiconductor substrate 1 being tilted at an angle of, e.g., about 40° under the conditions of, e.g., 30 keV and $40\times10^{13}/cm^2$. Side-wall oxide films 9 are formed by depositing a silicon oxide film at a thickness of 800 Å by, e.g., CVD, and etching back the thus-formed silicon oxide film. The source/drain regions 3 are formed by implanting, e.g., arsenic ions, into the semiconductor substrate 1 under the conditions of 50 keV and $40\times10^{15}/cm^2$. An NMOS transistor is completed by subjecting the substrate to a heat treatment of, e.g., 800° C. and 60 minutes (FIG.17).

FIG. 19 is a cross sectional view showing the construction of a second conventional semiconductor device, which is a DRAM cell. In the drawing, the same reference numerals are given to the corresponding elements of the first conventional semiconductor device, and the explanation thereof will be omitted here for brevity. Reference numeral 10 denotes diffusion layers formed in an active region surrounded by device isolation oxide film 2 of a semiconductor substrate 1; 11, word lines formed on the semiconductor substrate 1; 12, a first interlayer insulation film so formed as to cover the word line 11; 13, a first contact hole formed through the first interlayer insulation film 12 to the top surface of the diffusion layer 10; and 14, a bit line so formed as to fill the first contact hole 13. The bit line 14 is made up of a polycrystalline silicon film 15 doped with a dopant, e.g., phosphorous, for determining its conductivity type, a titanium silicide film 16, and a tungsten silicide film 17 which are stacked in the above order.

Numeral 18 denotes a second interlayer insulation film so formed as to cover the bit line 14; 19, second contact holes formed through the first and second interlayer insulation films 12 and 18 to the top surface of the diffusion layer 10; and 20, capacitors so formed as t o fill the respective second contact holes 19. Each capacitor 20 is made up of a storage node 21, a capacitor insulation film 22, and a cell plate 23 which are stacked in this order.

A method of manufacturing the DRAM cell of the second prior art having the above-mentioned construction will now be described in conjunction with FIGS. 20A–20C. First, the device isolation oxide film 2 is formed on the semiconductor substrate 1 by the LOCOS method. Then, the word lines 11 is formed with, e.g., a polycrystalline silicon film. The diffusion layers 10 are then formed on the semiconductor substrate 1 by implanting, e.g. , arsenic ions into the semiconductor substrate 1. A first interlayer insulation film 12 is deposited at a thickness of 600 Å by, e.g., CVD. The first contact hole 13 is formed by etching a desired portion of the first interlayer insulation film 12 to the top surface of the diffusion layer 10 by photolithography (FIG. 20A).

A polycrystalline silicon film 15 that is doped with a dopant, e.g., phosphorous, for determining its conductivity type at a dose of $5\times10^{20}/cm^2$ is deposited at a thickness of 800 Å by CVD. A titanium silicide film 16 is deposited at a thickness of, e.g., 150 Å by sputtering, and a tungsten silicide film 17 is deposited at a thickness of e.g., 800 Å by sputtering (FIG. 20B). Subsequently, the bit line 14 is formed by etching prescribed portions of the polycrystalline silicon film 15, the titanium silicide film 16, and the tungsten silicide film 17 by photolithography (FIG. 20C).

A second interlayer insulation film 18 is deposited at a thickness of 5,000 Å by, e.g., CVD, and the second contact hole 19 is formed by etching a desired portion of the first and second interlayer insulation films 12 and 18 to the top surface of the diffusion layer 10 by photolithography. The storage node 21 is then formed by depositing polycrystalline silicon that is doped with, e.g., phosphorous and has a thickness of 5,000 Å, and patterning the polycrystalline silicon film. The capacitor insulation film 22 is formed on the storage node 21 at a thickness of, e.g., 100 Å, and the cell plate 23 comprised of, e.g., a polycrystalline silicon film is formed at a thickness of 1,000 Å, thereby constituting the capacitor 20. As a result, a DRAM cell is completed (FIG. 19).

FIG. 21 is a cross sectional view showing the construction of a dual gate CMOS semiconductor of a third prior art. In this drawing, the same reference numerals are given to the corresponding elements of the conventional semiconductor devices set forth above, and the explanation thereof will be omitted here for brevity. Reference numeral 24 denotes a P well formed in an NMOS formation region I of a semiconductor substrate 1; 25, an N well formed in a PMOS formation region II of the semiconductor substrate 1; 26, N-type source/drain regions formed on the semiconductor substrate 1 in the NMOS formation region I; and 27, P-type source/drain regions formed on the semiconductor substrate 1 in the PMOS formation region II.

Reference numeral 28 denotes an NMOS gate electrode formed in the NMOS formation region I. The NMOS gate electrode 28 comprises an N-type polycrystalline silicon film 29 doped with a dopant, e.g., phosphorous, for determining a first conductivity type, a titanium silicide film 7, and a tungsten silicide film 8 which are stacked in the above order. Reference numeral 30 denotes a PMOS gate electrode formed in the PMOS formation region II. This PMOS gate electrode comprises a P-type polycrystalline silicon film 31 doped with a dopant, e.g., boron, for determining a second conductivity type, a titanium silicide film 7, and a tungsten silicide film 8 which are stacked in the above order.

A method of manufacturing the dual gate CMOS of the third prior art having the above construction will now be described in conjunction with FIGS. 22A–22C. The device isolation oxide film 2 is formed on the semiconductor substrate 1 by the LOCOS method. The P well 24 is formed by forming an opening in a resist film only in the NMOS formation region I using photolithography, and implanting, e.g., boron ions, through the opening while changing the implantation energy. The N well 25 is formed by forming an opening in a resist film only in the PMOS formation region I using photolithography, and implanting, e.g., phosphorous ions, through the opening while changing the implantation energy. Subsequently, the gate oxide film 4 is formed at a thickness of 60 Å by oxidizing the top surface of the semiconductor substrate 1 by, e.g., thermal oxidation. A polycrystalline silicon film having a thickness of 800 Å is then formed on the gate oxide film 4 by using, e.g., CVD. The N-type polycrystalline silicon film 29 is formed by forming an opening in a resist film only above the P well 24 using photolithography, and implanting, e.g., arsenic ions into the polycrystalline silicon film under the conditions of 50 keV and $4\times10^{15}/cm^2$. The P-type polycrystalline silicon film 31 is formed by forming an opening in a resist film only above the N well 25 using photolithography, and implanting, e.g., boron ions into the polycrystalline silicon film under the conditions of 10 keV and $4\times10^{15}/cm^2$ (FIG. 22A).

titanium silicide film 7 having a thickness of, e.g., 150 Å is formed by sputtering. A tungsten silicide film 8 having a thickness of, for example, 800 Å is also formed by sputtering (FIG. 22B). The NMOS and PMOS gate electrodes 28 and 30 are formed by respectively etching prescribed portions of the N-type and P-type polycrystalline silicon films 29 and 31, the titanium silicide film 7, and the tungsten silicide film 8 by photolithography (FIG. 22C).

LDD layers are then formed by implanting, e.g., arsenic ions into the P well 24 in the NMOS formation region I under the conditions of 30 keV and $4\times10^{13}/cm^2$ while tilting the semiconductor substrate 1 at 40°. The side-wall oxide films 9 are formed by depositing a silicon oxide film at a thickness of 800 Å by, e.g., CVD, and etching back the silicon oxide film. The N-type source/drain regions 26 are then formed by forming an opening in a resist film only in the NMOS formation region I using photolithography, and implanting, e.g., arsenic ions through the opening under the conditions of 50 keV and $4\times10^{15}/cm^2$. The P-type source/drain regions 27 are formed by forming an opening in a resist film only in the PMOS formation region II using photolithography, and implanting, e.g., boron ions into through opening under the conditions of 10 keV and $4\times10^{15}/cm^2$. A dual gate CMOS is completed by subjecting the substrate to a heat treatment of, e.g., 800° C. and 60 minutes (FIG. 21).

Because the semiconductor devices of the prior art have the above described constructions, they have various problems described below. To begin with, the dopants for determining the conductivity type contained in the polycrystalline silicon films 6, 15, 29 and 31 are diffused into the titanium silicide films 7 and 16 and the tungsten silicide films 8 and 17 which are formed on the polycrystalline silicon films as a result of a variety of heating processes carried out after the titanium silicide films 7 and 16 and the tungsten silicide films 8 and 17 have been formed. Eventually, the concentrations of the dopants in the polycrystalline silicon films 6, 15, 29 and 31 become low. As a result of this phenomenon, a depletion layer is formed across each of the interfaces between the respective gate electrodes 5, 28 and 30 and the gate oxide film 4, whereby the gate capacitance is increased, which in turn results in decreased current drive capability of the device and an increased threshold voltage. Further, the previously mentioned phenomenon results in an increased resistance of the bit line 14 and prolonged read time.

In the case of the dual gate CMOS, because the NMOS formation region I and the PMOS formation region II are formed as shown in FIG. 23, the previously mentioned phenomenon causes the N-type and P-type dopants, which have entered the titanium silicide film 7 and the tungsten silicide film 8 as a result of heat treatments carried out after the formation of these films, to mix with each other by diffusing. As a result, if a distance "d" between the NMOS formation region I and the PMOS formation region II is smaller than a desired value, the work functions of the gate electrodes 28 and 30 are changed to vary the PMOS and NMOS characteristics. To prevent such variations in the characteristics, the distance "d" should be made large. Further, it is necessary to prevent the NMOS and PMOS characteristics from varying even if the mutual diffusion of the dopants arise. However, a large distance between the two formation regions obstructs miniaturization of the device.

native oxide film (not shown) of a few angstrom exists on the top surface of each of the polycrystalline silicon films 6, 15, 29 and 31. For this reason, the contact resistances between the titanium silicide films 7 and 16 and tungsten silicide films 8 and 17 and the polycrystalline silicon films 6, 15, 2 and 31 are increased. The increased contact resistance brings about an increase in the resistance value of each of the gate electrodes 5, 28 and 30, which in turn results in a drop of an applied voltage. The drop of the applied voltage leads to a decrease in current drive capability of the transistor. As for the bit line 14, an increased resistance prolongs the read time.

SUMMARY OF THE INVENTION

The present invention has been conceived to solve the 10 above described problems, and has an object of providing a semiconductor device which can improve the device characteristics by controlling the diffusion of a dopant for determining the conductivity type of a non-single-crystal silicon film. The invention is also intended to provide a manufacturing method of such a semiconductor device.

A semiconductor device, according to a first aspect of the present invention, has a wiring layer comprised of a non-single-crystal silicon film containing a dopant for determining its conductivity type, a titanium silicide film of the C49 and/or C54 structure, and a metal silicide film all of which films are laid one on another in this order. With this configuration, the titanium silicide film of the C49 and/or C54 structure prevents the dopant in the non-single-crystal silicon film from diffusing into the metal silicide film.

Therefore, an increase in the resistance of the non-single-crystal silicon film resulting from a drop in the dopant concentration of the non-single-crystal silicon film is suppressed, which enables provision of a semiconductor device with a wiring layer having a desired resistance.

A semiconductor device, according to a second aspect of the present invention, has a wiring layer comprised of a non-single-crystal silicon film containing a dopant for determining its conductivity type, a titanium silicide film of the C49 and/or C54 structure, a titanium nitride film, and a metal silicide film all of which are laid one on another in this order. With this configuration, not only the titanium silicide film having the C49 and/or C54 structure but also the titanium nitride film prevents the dopant in the non-single-crystal silicon film from diffusing into the metal silicide film. As a result, an increase in the resistance of the non-single-crystal silicon film resulting from a drop in the dopant concentration of the non-single-crystal silicon-film is further suppressed, which more positively enables provision of a semiconductor device with a wiring layer having a desired resistance.

A semiconductor device according to a third aspect of the present invention is characterized in that the wiring layer of the first or second aspect constitutes a gate electrode or a bit line. With this configuration, formation of a depletion layer in the gate electrode is suppressed, or an increase in the resistance of the bit line is suppressed. As a result, it becomes possible to provide a semiconductor device having improved device characteristics.

According to a fourth aspect of the present invention, a dual gate CMOS semiconductor device comprises, as gate electrodes, the wiring layers of the first or second aspect which respectively contain a first dopant for determining a first conductivity type and a second dopant for determining a second conductivity type in different non-single-crystal silicon films. With this configuration, the titanium silicide film of the C49 and/or C54 structure and/or the titanium nitride film prevents the dopant in the first or second conductivity type non-single-crystal silicon film from diffusing into the metal silicide film. Hence, an increase in the resistance of the non-single-crystal silicon-film resulting from a drop in the dopant concentration in the non-single-crystal silicon film is suppressed, which enables provision of a gate electrode having a desired resistance. Further, as a result of this, the dopants for the first and second conductivity types are prevented from diffusing to mix each other, which allows the distance between the gate electrodes of the first and second conductivity types to be made small, and thereby enables provision of a miniaturized semiconductor device.

A semiconductor device of a fifth aspect is similar to the semiconductor device of any one the first through fourth aspects, but the non-single-crystal silicon film further contains nitrogen. With this configuration, diffusion of the dopant in the non-single-crystal silicon film into the metal silicide film is prevented by not only the titanium silicide film of the C49 and/or C54 structure and the titanium nitride film, but also nitrogen. As a result, an increase in the resistance of the non-single-crystal silicon film resulting from a drop in the dopant concentration of the non-single-crystal silicon film is further suppressed, which more positively enables provision of a semiconductor device with a wiring layer having a desired resistance.

A semiconductor device of a sixth aspect is similar to the semiconductor device of any one the first through fifth aspects, but the titanium silicide film of the C49 and/or C54 structure is formed at a thickness of not less than 20 Å. With this configuration, the titanium silicide film of the C49 and/or C54 structure having a thickness of not less than 20 Å positively prevents the dopant in a non-single-crystal silicon film from diffusing into the metal silicide film. As a result, an increase in the resistance of the non-single-crystal silicon film resulting from a drop in the dopant concentration of the non-single-crystal silicon film is further suppressed, which ensures provision of a semiconductor device with a wiring layer having a desired resistance.

According to a seventh aspect of the present invention, a method of manufacturing a semiconductor device comprises the steps of sequentially forming a non-single-crystal silicon film containing a dopant for determining its conductivity type, a titanium film, and a metal silicide film on a substrate; and forming a titanium silicide film of the C49 and/or C54 structure by reacting the titanium film with the non-single-crystal silicon film using a heat treatment. With the above manufacturing method, the titanium silicide film of the C49 and/or C54 structure prevents the dopant in the non-single-crystal silicon film from diffusing into the metal silicide film. As a result, it becomes possible to suppress an increase in the resistance of the non-single-crystal silicon film resulting from a drop in the dopant concentration of the non-single-crystal silicon film. Further, a native oxide film on the non-single-crystal silicon film is eliminated being reduced by titanium of the titanium film, as a result of which it becomes possible to suppress an increase in resistance due to the native oxide film.

According to an eighth aspect of the present invention, a method of manufacturing a semiconductor device comprises the steps of sequentially forming a non-single-crystal silicon film containing a dopant for determining its conductivity type, a titanium film, a titanium nitride film, and a metal silicide film on a substrate; and forming a titanium silicide film of the C49 and/or C54 structure by reacting the titanium film with the non-single-crystal silicon film using a heat treatment. With this manufacturing method, not only the titanium silicide film of the C49 and/or C54 structure but also the titanium nitride film prevents the dopant in the non-single-crystal silicon film from diffusing into the metal silicide film. As a result, an increase in the resistance of the non-single-crystal silicon film resulting from a drop in the dopant concentration of the non-single-crystal silicon film is further suppressed. Moreover, a native oxide film on the non-single-crystal silicon film is eliminated being reduced by titanium of the titanium film, as a result of which it becomes possible to suppress an increase in resistance due to the native oxide film.

According to a ninth aspect of the present invention, a method of manufacturing a dual gate CMOS semiconductor device comprises the steps of forming a non-single-crystal silicon film on a semiconductor substrate; implanting a dopant for determining a first conductivity type and a dopant for determining a second conductivity type into different regions of the non-single-crystal silicon film; sequentially forming a titanium film, a metal silicide film, or a titanium film, a titanium nitride film, and a metal silicide film on the non-single-crystal silicon film; forming a titanium silicide film of the C49 and/or C54 structure by reacting the titanium film with the non-single-crystal silicon film using a heat treatment; patterning a multiple layer of the non-single-crystal silicon film, the titanium silicide film, and the metal silicide film, or a multiple layer of the non-single-crystal silicon film, the titanium silicide film, the titanium nitride film, and the metal silicide film, thereby forming gate electrodes respectively having the first and second conductivity types. With this manufacturing method, the titanium silicide film of the C49 and/or C54 structure and/or the titanium nitride film prevents diffusion of the dopants in the first and second conductivity type non-single-crystal silicon films from diffusing into the metal silicide film. For this reason, an increase in the resistance of the non-single-crystal silicon film resulting from a drop in the dopant concentrations of the non-single-crystal silicon-film is suppressed, and it becomes possible to provide gate electrodes having a desired resistance. Further, as a result of this, the dopants for the first and second conductivity types dopants are prevented from diffusing to mix each other, which allows the distance between the gate electrodes of the first and second conductivity types to be made smaller and, eventually, allows miniaturization of a semiconductor device. Furthermore, a native oxide film on the non-single-crystal silicon film is eliminated being reduced by titanium of the titanium film, as a result of which it becomes possible to suppress an increase in resistance due to the native oxide film.

A manufacturing method of a tenth aspect is similar to that of any one of the seventh through ninth aspects, but it further comprises the step of implanting nitrogen ions into the non-single-crystal silicon film. With this manufacturing method, diffusion of the dopant in the non-single-crystal silicon film into the metal silicide film is prevented by the titanium silicide film of the C49 and/or C54 structure and/or the titanium nitride film as well as by nitrogen. As a result, it becomes possible to suppress an increase in the resistance of a non-single-crystal silicon film resulting from a drop in the dopant concentration in the non-single-crystal silicon film.

A manufacturing method of an eleventh aspect is similar to that of any one of the seventh through tenth aspects, but a titanium silicide film mainly having the C49 structure is formed by reacting the titanium film with the non-single-crystal silicon film by performing a heat treatment at about 500° C. With this manufacturing method, formation of the titanium silicide film of the C49 structure is ensured, and the titanium silicide film of the C49 structure positively prevents the dopant in the non-single-crystal silicon film from diffusing into the metal silicide film, whereby it becomes possible to positively suppress an increase in the resistance of the non-single-crystal silicon film resulting from a drop in the dopant concentration of the non-single-crystal silicon film.

A manufacturing method of a twelfth aspect is similar to that of any one of the seventh through tenth aspects, but the titanium silicide film mainly having the C54 structure is formed by reacting the titanium film with the non-single-crystal silicon film by performing a heat treatment at about 700° C. With this manufacturing method, formation of the titanium silicide film of the C54 structure is ensured, and the titanium silicide film of the C54 structure positively prevents the dopant in the non-single-crystal silicon film from diffusing into the metal silicide film, whereby it becomes possible to positively suppress an increase in the resistance of the non-single-crystal silicon film resulting from a drop in the dopant concentration of the non-single-crystal silicon film.

A manufacturing method of a thirteenth aspect is similar to that of any one of the seventh through tenth aspects, but the titanium silicide film made of a mixed crystal of the C49 and C54 structures is formed by reacting the titanium film with the non-single-crystal silicon film by performing a heat treatment at 500° C. to 700° C. With this manufacturing method, formation of the titanium silicide film made of a mixed crystal of the C54 and the C49 structures is ensured, and that titanium silicide film positively prevents the dopant in the non-single-crystal silicon film from diffusing into the metal silicide film, whereby it becomes possible to positively suppress an increase in the resistance of the non-single-crystal silicon film resulting from a drop in the dopant concentration of the non-single-crystal silicon film.

A manufacturing method of a fourteenth aspect is similar to that of any one of the seventh through thirteenth aspects, but the titanium film is formed at a thickness of not less than 10 Å. With this manufacturing method, the titanium silicide film of the C49 and/or C54 structure is reliably formed at a desired thickness, and the titanium silicide film of the C49 and/or C54 structure having a desired thickness positively prevents the dopant in the non-single-crystal silicon film from diffusing into the metal silicide film. As a result, it becomes possible to positively suppress an increase in the resistance of the non-single-crystal silicon film resulting from a drop in the dopant concentration of the non-single-crystal silicon film.

BRIEF DESCRIPTION OF THE INVENTION

DESCRIPTION OF THE PREFERRED EMBODIMENTS

Embodiment 1

Figure 1:
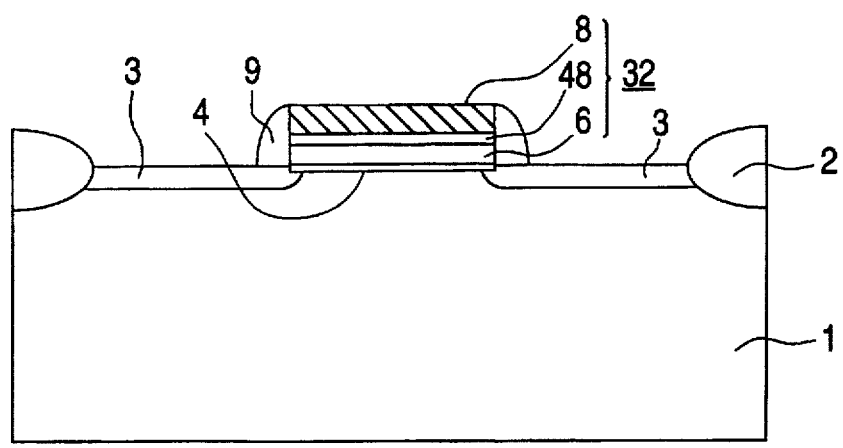
FIG. 1 is a cross sectional view showing the construction of a semiconductor device according to a first embodiment of the invention.

A first embodiment of the present invention will be explained below with reference to the accompanying drawings. FIG. 1 is a cross sectional view showing the construction of a semiconductor, i.e., an NMOS transistor, according to the first embodiment of the invention. In the drawing, the same reference numerals are given to the corresponding elements of the previously mentioned conventional semiconductor devices, and the explanation thereof will be omitted here for brevity. Reference numeral 48 denotes a titanium silicide film of the C54 structure which is formed between a polycrystalline silicon film 6 and a tungsten silicide film 8, and numeral 32 denotes a gate electrode comprising the polycrystalline silicon film 6, the titanium silicide film 48 of the C54 structure, and the tungsten silicide film 8 which are stacked in the above order. The titanium silicide film 48 of the C54 structure has a face-centered rhombic crystal structure, in which the crystal constants are a=0.824 nm, b=0.478 nm, and c=0.854 nm.

Figure 2A:
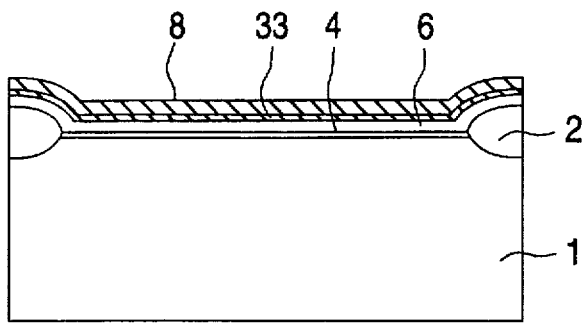
FIGS. 2A–2C are cross sectional views showing the manufacturing steps of the semiconductor device shown in FIG. 1.

Now, a method of manufacturing the semiconductor device of the first embodiment having the above-described construction will be described in conjunction with FIGS. 2A–2C. First, like the conventional semiconductor devices, a device isolation oxide film 2 is formed on a semiconductor substrate 1 by the LOCOS method. A gate oxide film 4 is then formed at a thickness of 60 Å by oxidizing the top surface of the semiconductor substrate 1 by, e.g., thermal oxidation. A polycrystalline silicon film 6 doped with a dopant for determining its conductivity type, e.g., phosphorous, at a dose of $5\times10^{20}/cm^2$ is formed on the gate oxide film 4 at a thickness of, e.g., 800 Å by, for instance, CVD. A titanium film 33 is then formed on the polycrystalline silicon film 6 at a thickness of, for example, 50 Å by sputtering. A tungsten silicide film 8 is then formed on the titanium film 33 at a thickness of, for example, 800 Å by sputtering (FIG. 2A).

Figure 2B:
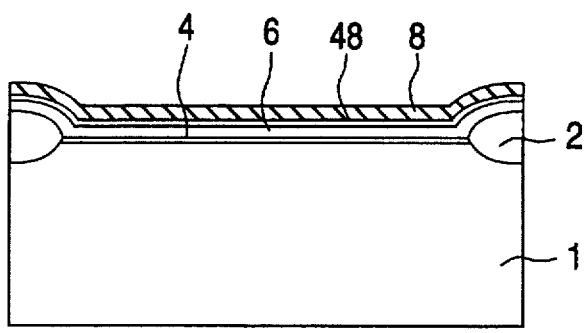

A heat treatment of RTA (rapid thermal annealing) is then carried out for 30 seconds at 700° C. to react the titanium film 33 with the polycrystalline silicon film 6, so that a titanium silicide film 48 of the C54 structure is formed (FIG. 2B). At this time, a native oxide film of a few angstrom which exists on the polycrystalline silicon film 6 turns into TiO (titanium oxide) as a result of reducing action of titanium of the titanium film 33, and is discharged into the atmosphere.

Figure 2C:
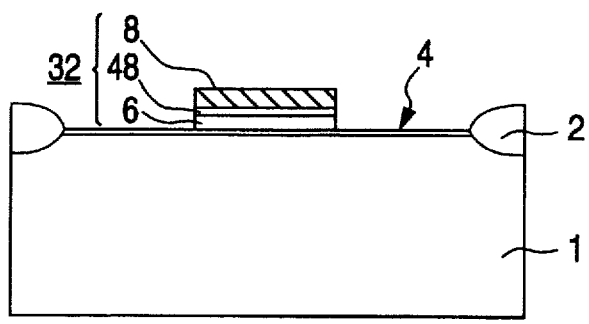

The gate electrode 32 is formed by etching prescribed portions of the tungsten silicide film 8, the titanium silicide film 48 of the C54 structure, and the polycrystalline silicon film 6 using photolithography (FIG. 2C). Arsenic ions, for example, are then implanted into the semiconductor substrate 1 under the conditions of 30 keV and $40\times10^{13}/cm^2$ while the semiconductor substrate 1 is tilted at, for example, 40°, to form LDD layers. A silicon oxide film is deposited at a thickness of 800 Å by, e.g., CVD, and the side-wall oxide films 9 are formed by etching back the thus-deposited silicon oxide film. Source/drain regions 3 are formed by implanting, e.g., arsenic ions, into the semiconductor substrate 1 under the conditions of 50 keV and $40\times10^{15}/cm^2$. An NMOS transistor is completed by subjecting the semiconductor substrate to a heat treatment of, e.g., 800° C. and 60 minutes (FIG. 1).

During this heating treatment or various heat treatments which will be commonly performed in later processes, the titanium silicide film 48 does not lose its C54 structure.

Figure 13:
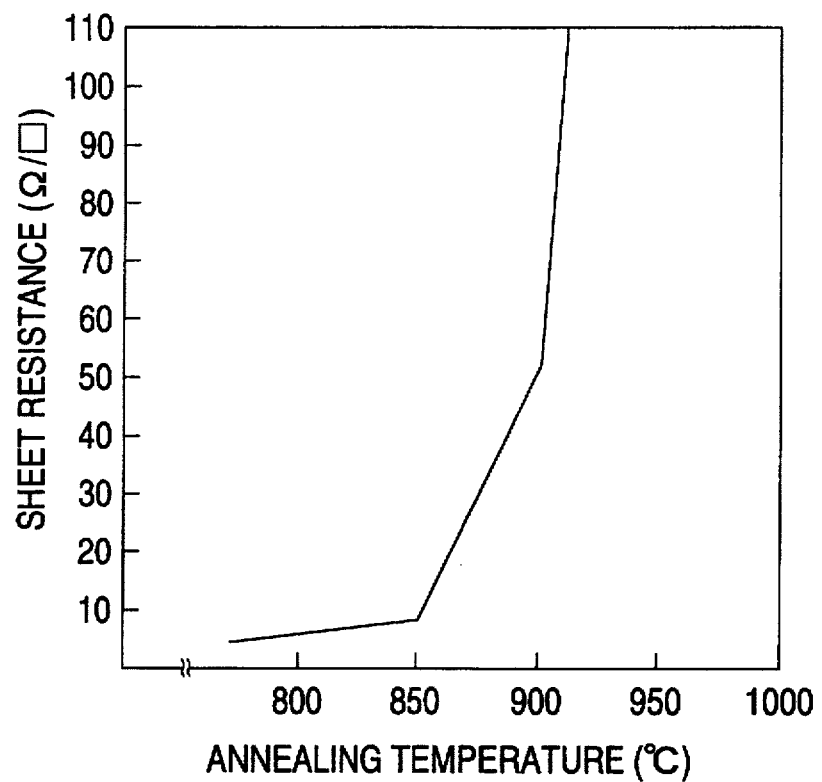
FIG. 13 is a graph showing a dependence of the titanium silicide film having the C54 structure on the heat treatment.

This will be explained with reference to FIG. 13. FIG. 13 is a graph showing sheet resistances of titanium silicide films obtained by subjecting titanium silicide films of the C54 structure to heat treatments of different temperatures. As is evident from the drawing, the sheet resistance of the titanium silicide film increases steeply as the heat treatment temperature increases from 850° C. This is considered due to a phenomenon that the titanium silicide film loses its C54 structure and starts to coagulate as a result of phase change. In neither the above-mentioned heating process of about 800° C. and 60 minutes nor various heat treatments commonly performed in later processes (where in general the temperature does not exceed 850° C.), the titanium silicide film will not lose its C54 structure.

The semiconductor device of the first embodiment constructed in the above way has the titanium silicide film 48 of the C54 structure that is formed between the polycrystalline silicon film 6 and the tungsten silicide film 8. With this construction, the titanium silicide film 48 of the C54 structure prevents the dopant for determining the conductivity type, e.g., phosphorous, included in the polycrystalline silicon film 6 from diffusing into the tungsten silicide film 8

A titanium silicide film of the prior art formed by sputtering does not possess the C49 or C54 structure even if heated in a later process, and has particle sizes approximately in a range of 0.02–0.05 μm. In contrast, the particle size of the titanium silicide film 48 of the C54 structure is as large as about 2.0–3.0 μm, so it has a high density. Thus, the titanium silicide film 48 can prevent the diffusion of the dopant for determining the conductivity type, e.g., phosphorous.

Figure 14:
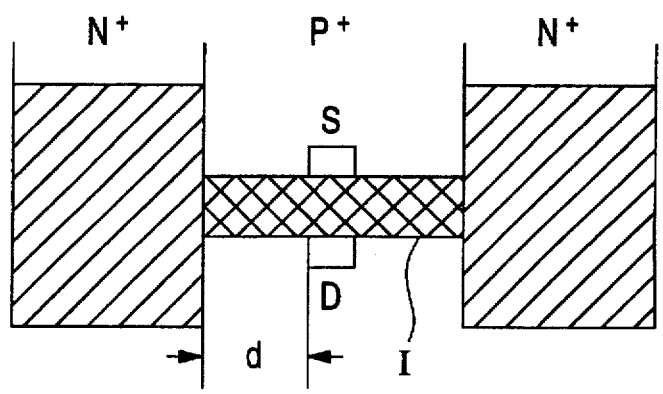
FIG. 14 shows a transistor in a P+ region in a case where the P+ region is formed adjacent to N+ regions.

The prevention of the diffusion of, e.g., phosphorous by the titanium silicide film of the C54 structure will be explained with reference to FIGS. 14 and 15. In FIG. 14, two N+ regions are formed adjacent to a P+ region, and the two N+ regions are connected to each other by a wiring line (gate electrode) I. The distance from source/drain regions (S/D) formed in the P+ region to the N+ region is represented by "d."

Figure 15:
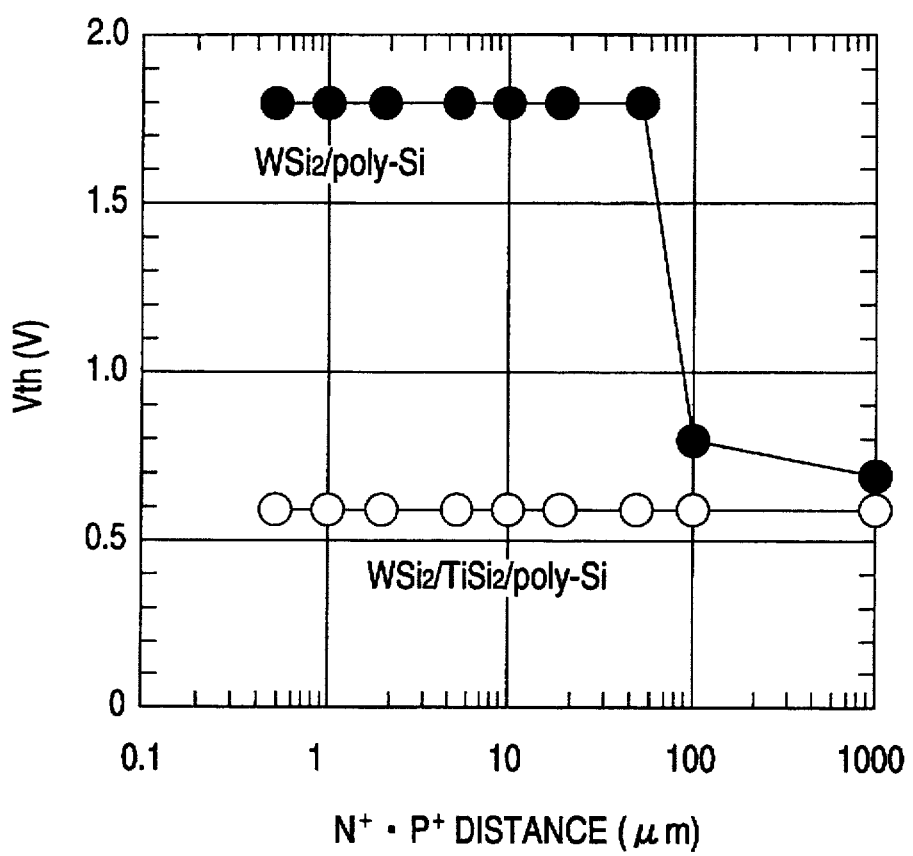
FIG. 15 is a graph showing a variation in threshold voltage of the transistor shown in FIG. 14.

FIG. 15 shows a relationship between the threshold voltage Vth of the transistor in the P+ region and the distance "d" shown in FIG. 14 for respective cases where the wiring line I is a double layer of tungsten silicide and polycrystalline silicon, and where it is a triple layer of tungsten silicide, titanium silicide of the C54 structure, and polycrystalline silicon. The term $TiSi_2$ appearing in FIG. 15 means a titanium silicide film having the C49 or C54 structure, or made of a mixed crystal of the C49 and C54 structure.

As is evident from FIG. 15, if the distance "d" decreases from 100 μm, the threshold voltage Vth of the transistor with the tungsten silicide film and the polycrystalline silicon film increases. This is because the dopants for determining the conductivity type included in the polycrystalline silicon film enter the tungsten silicide film and diffuse therein, so that the dopants for the different conductivity types compensate each other in the N+ and P+ regions, which results in reduced effective concentrations and changes of the work functions.

On the other hand, in the device of the present invention provided with the titanium silicide film of the C54 structure, the threshold voltage Vth remains unchanged even if the distance "d" is small. This is attributable to the fact that the titanium silicide film of the C54 structure prevents the dopants for determining the conductivity type included in the polycrystalline silicon film from entering the tungsten silicide film. In view of the above, it is evident that the titanium silicide film of the C54 structure prevents diffusion of the dopant for determining the conductivity type.

Thus, the invention suppresses formation of a depletion layer across the interface between the gate electrode 32 and the gate oxide film 4, realizing a semiconductor device, i.e., an NMOS transistor, having high drive capability.

This will be further explained with reference to FIG. 16. As shown in the drawing, in the device that is not provided with the titanium silicide film of the C54 structure, the dopant for determining the conductivity type diffuse into the tungsten silicide film. Hence, a depletion layer extends into the gate electrode, as a result of which the gate capacitance in the inversion range is smaller than that of in the accumulation range. On the other hand, in the device having the titanium silicide film of the C54 structure, the dopant for determining the conductivity type is prevented from diffusing into the tungsten silicide film, so that the gate capacitance in the inversion range is the same as that in the accumulation range. The term $TiSi_2$ in FIG. 16 means a titanium silicide film having the C49 or C54 structure, or made of a mixed crystal of the C54 and C49 structures.

Further, because a native oxide film existing on the top surface of the polycrystalline silicon film 6 is eliminated being reduced by titanium of the titanium film 33, which has strong reducing action, when the titanium film 33 reacts with the polycrystalline silicon film 6. As a result, the native oxide film having high resistance disappears, enabling formation of a low-resistance gate electrode.

The resistivity of the titanium silicide film 48 of the C54 structure is about 15–30 μΩ-cm, which is smaller than about 25 Ω-cm of the titanium silicide film not having the C54 or C49 structure formed by the conventional sputtering method. This allows the gate electrode 32 to have a further lower resistance.

Figure 16:
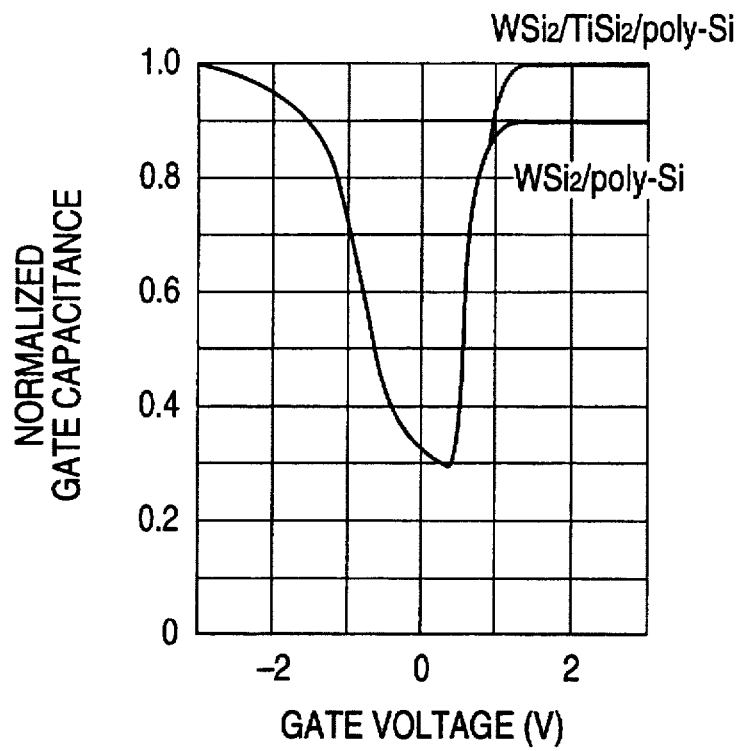
FIG. 16 is a graph showing variations in gate capacitance in an accumulation range and an inversion range.
Figure 17:
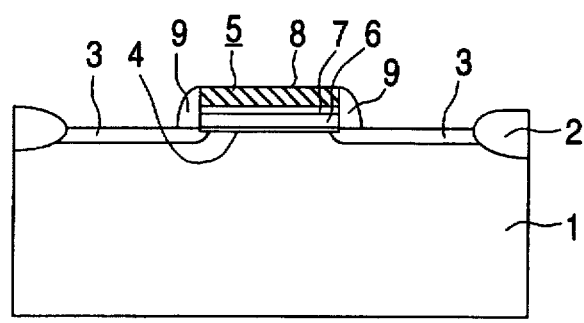
FIG. 17 is a cross sectional view showing the construction of a first prior art semiconductor device.
Figure 18A:
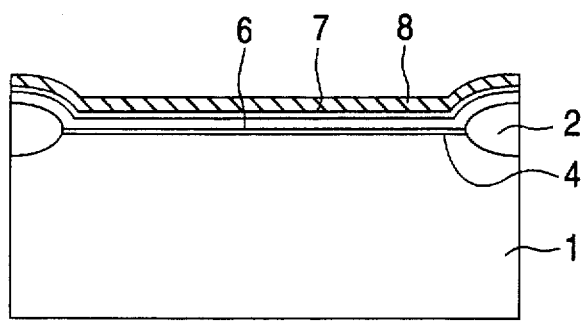
FIGS. 18A and 18B are cross sectional views showing the manufacturing steps of the semiconductor device shown in FIG. 13.
Figure 18B:
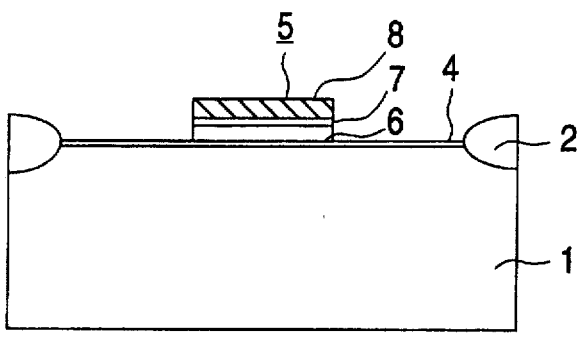
Figure 19:
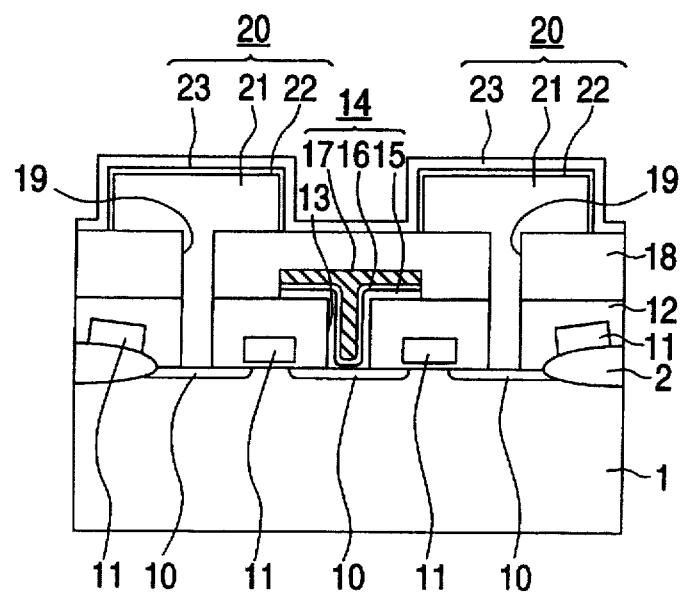
FIG. 19 is a cross sectional view showing the construction of a second prior art semiconductor device.
Figure 20A:
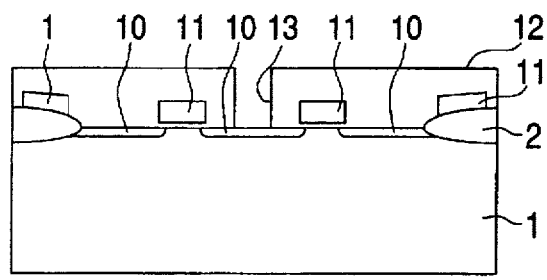
FIGS. 20A–20C are cross sectional views showing the manufacturing steps of the semiconductor device shown in FIG. 15.
Figure 20B:
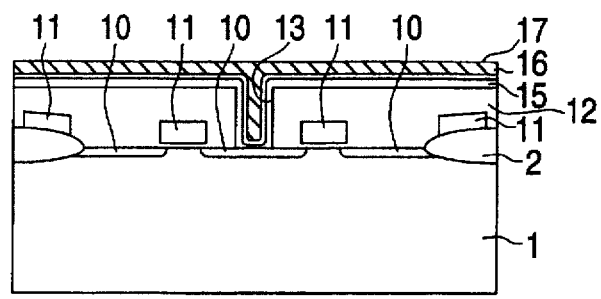
Figure 20C:
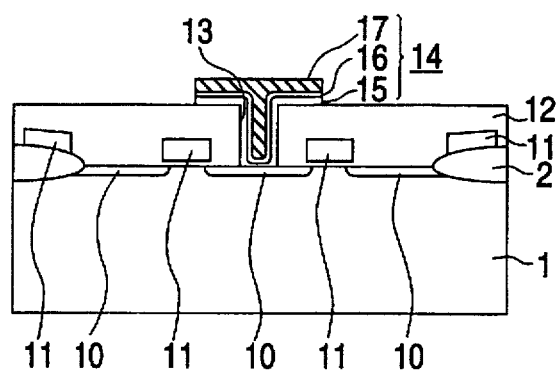
Figure 21:
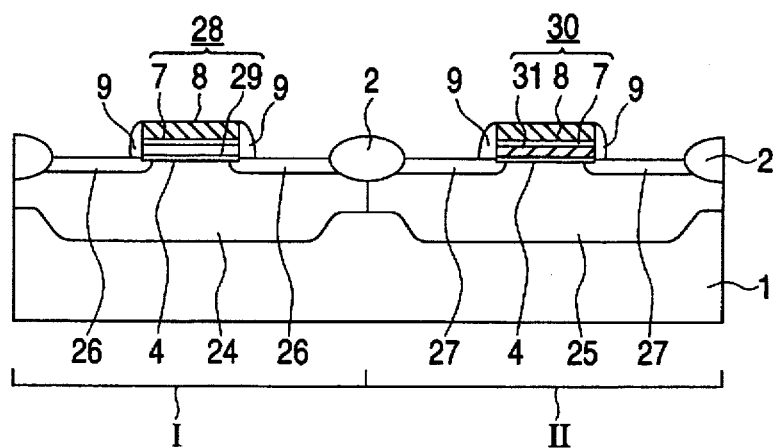
FIG. 21 is a cross sectional view showing the construction of a third prior art semiconductor device.
Figure 22A:
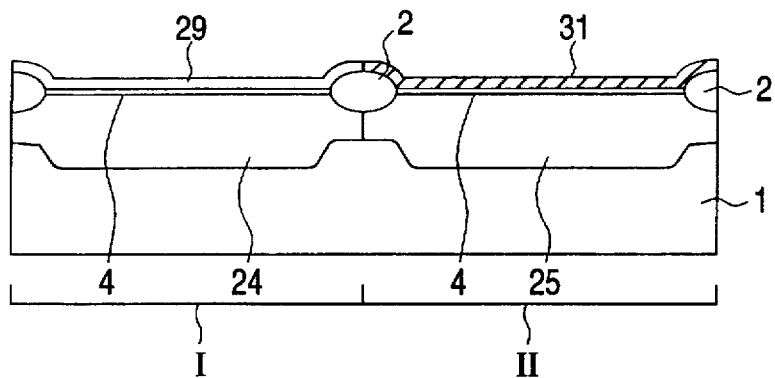
FIGS. 22A–22C are cross sectional views showing the manufacturing steps of the semiconductor device shown in FIG. 17.
Figure 22B:
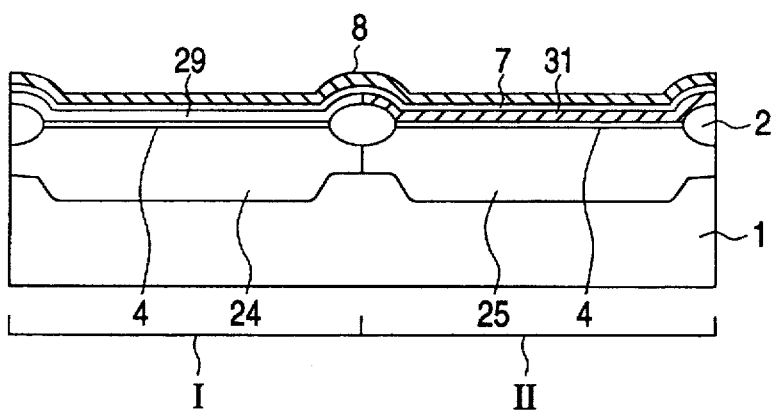
Figure 22C:
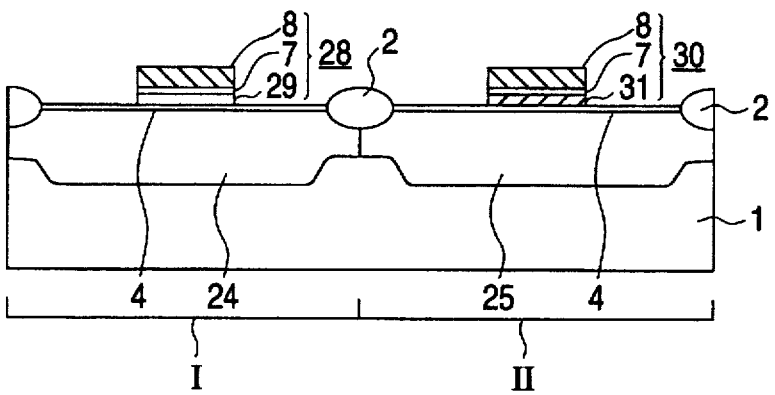

FIGS. 15 and 16 do not show results of a device having the titanium silicide film formed between the tungsten silicide film and the polycrystalline silicon film by sputtering, but this case exhibits the same results as the case of the device having the double layer consisting of the tungsten silicide film and the polycrystalline silicon film.

Embodiment 2

Figure 3:
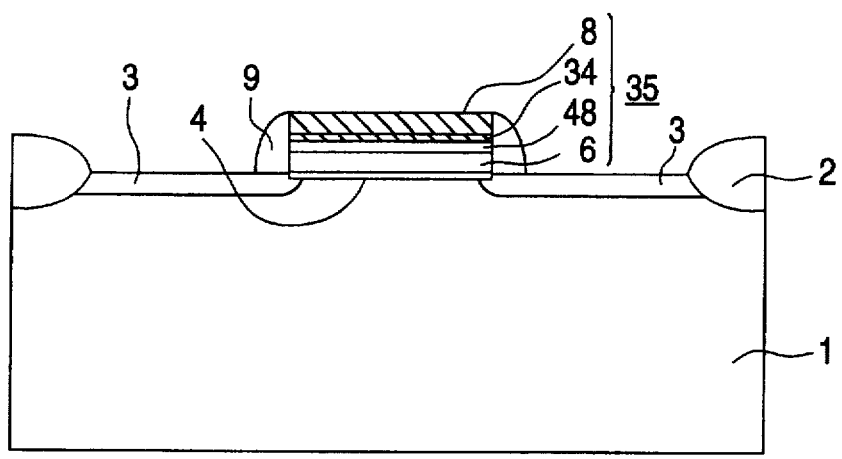
FIG. 3 is a cross sectional view showing the construction of a semiconductor device according to a second embodiment of the invention.

FIG. 3 is a cross sectional view showing the construction of a semiconductor device, i.e., an NMOS transistor, according to a second embodiment of the present invention. In the drawing, the same reference numerals are given to the corresponding elements in the first embodiment, and hence the explanation thereof will be omitted here for brevity. Reference numeral 34 denotes a titanium nitride film formed between a titanium silicide film 48 of the C54 structure and a tungsten silicide film 8, and numeral 35 denotes a gate electrode formed by the polycrystalline silicon film 6, the titanium silicide film 48 of the C54 structure, the titanium nitride film 34, and the tungsten silicide film 8 which are stacked in the above order.

Figure 4A:
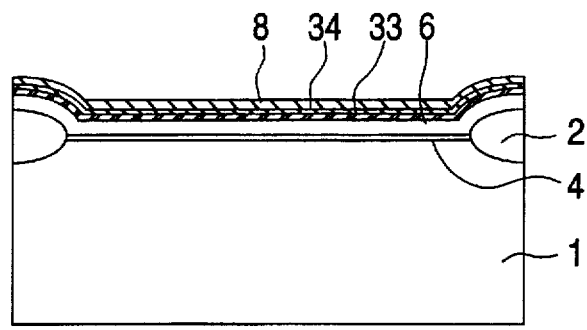
FIGS. 4A–4C are cross sectional views showing the manufacturing steps of the semiconductor device shown in FIG. 3.

Next, a method of manufacturing the semiconductor device of the second embodiment having the above-described construction will be explained in conjunction with FIGS. 4A–4C. A device isolation oxide film 2 is formed on a semiconductor substrate 1 by the LOCOS method in the same manner as in the first embodiment. A gate oxide film 4 is then formed at a thickness of 60 Å by oxidizing the top surface of the semiconductor substrate 1 by thermal oxidation. A polycrystalline silicon film 6 doped with a dopant for determining its conductivity type, e.g., phosphorous, at a dose of $5 \times 10^{20}/cm^2$ is deposited at a thickness of, e.g., 800 Å by, e.g., CVD. A titanium film 33 having a thickness of, for example, 50 Å is then formed on the polycrystalline silicon film 6 by sputtering. Subsequently, a titanium nitride film 34 having a thickness of, for example, 100 Å and a tungsten silicide film 8 having a thickness of, for example, 800 Å, are formed in this order also by sputtering (FIG. 4A).

Figure 4B:
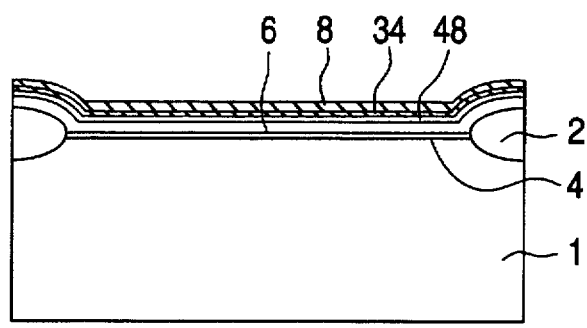

The substrate is then subjected to a heat treatment of RTA for 30 seconds at a temperature of 700° C. to react the titanium film 33 with the polycrystalline silicon film 6, whereby a titanium silicide film 48 of the C54 structure is formed (FIG. 4B). At this time, a native oxide film of a few angstrom that exists on the polycrystalline silicon film 6 turns into TiO (titanium oxide) as a result of reducing action of titanium of the titanium film 33, and the reduced substance is discharged into the atmosphere.

Figure 4C:
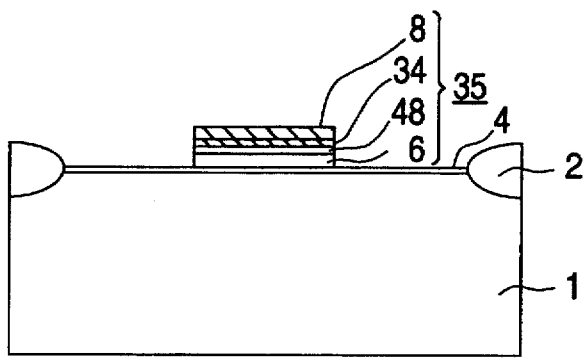

The gate electrode 35 is formed by etching prescribed portions of the tungsten silicide film 8, the titanium nitride film 34, the titanium silicide film 48 of the C54 structure, and the polycrystalline silicon film 6 using photolithography (FIG. 4C). Arsenic ions, for example, are then implanted into the semiconductor substrate 1 under the conditions of, e.g., 30 keV and $40 \times 10^{13}/cm^2$ while the semiconductor substrate 1 is tilted at, for example, 40° C., to form LDD layers. A silicon oxide film is deposited at a thickness of 800 Å by, e.g., CVD, and side-wall oxide films 9 are formed by etching back the thus-deposited silicon oxide film. Source/drain regions 3 are formed by implanting, e.g., arsenic ions into the semiconductor substrate 1 under the conditions of 50 keV and $40 \times 10^{15}/cm^2$. An NMOS transistor is completed by subjecting the semiconductor substrate to a heat treatment of, e.g., 800° C. and 60 minutes (FIG. 3).

The semiconductor device of the second embodiment constructed as described above has the titanium silicide film 48 of the C54 structure that is formed between the polycrystalline silicon film 6 and the tungsten silicide film 8 in the same manner as in the first embodiment, so that naturally similar advantages to those of the first embodiment are obtained. Further, the titanium nitride film 34, which is formed between the titanium silicide film 48 of the C54 structure and the tungsten silicide film 8, prevents more effectively the dopant for determining the conductivity type, e.g., phosphorous, contained in the polycrystalline silicon film 6 from diffusing into the tungsten silicide film 8.

Therefore, the formation of a depletion layer across the interface between the gate electrode 35 and the gate oxide film 4 is further suppressed, which in turn enables a semiconductor device, i.e., an NMOS transistor, having a further higher drive capability.

Embodiment 3

Figure 5:
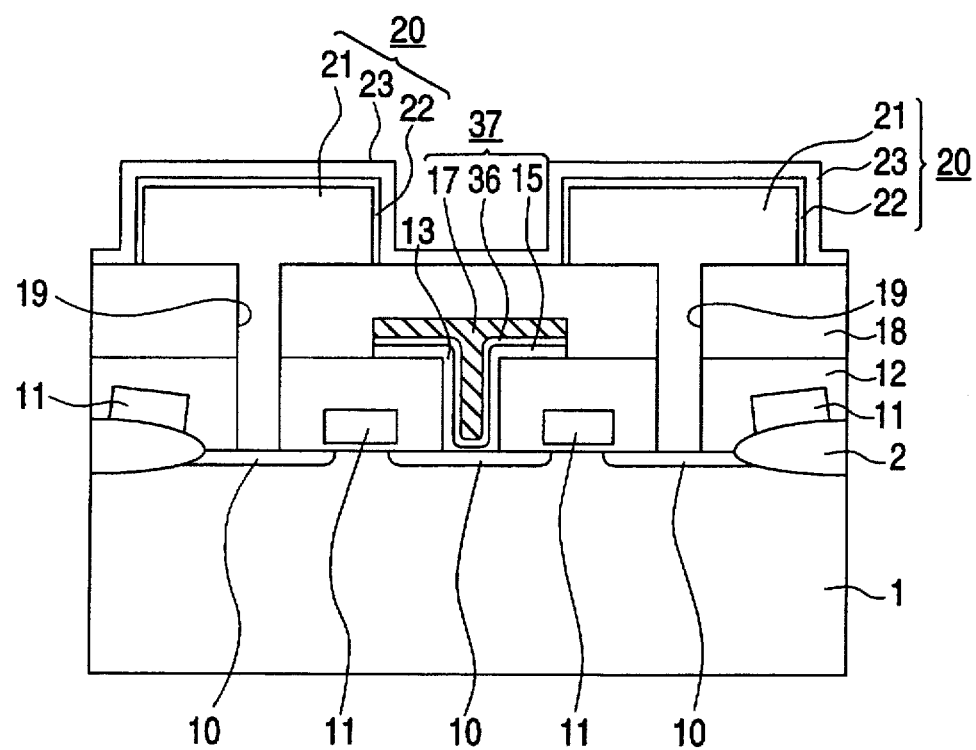
FIG. 5 is a cross sectional view showing the construction of a semiconductor device according to a third embodiment of the invention.

FIG. 5 is a cross sectional view showing the construction of an DRAM cell semiconductor device according to a third embodiment of the present invention. In the drawing, the same reference numerals are given to the corresponding elements in the conventional device, and hence the explanation thereof will be omitted here for brevity. Reference numeral 36 denotes a titanium silicide film of the C49 or C54 structure formed between a polycrystalline silicon film 15 and a tungsten silicide film 17, and numeral 37 denotes a bit line so formed as to fill a first contact hole 13. The bit line 14 comprises a polycrystalline silicon film 15 doped with, for example, phosphorous as a dopant for determining its conductivity type, a titanium silicide film 36 of the C54 structure, and a tungsten silicide film 17 which are stacked in the above order.

Figure 6A:
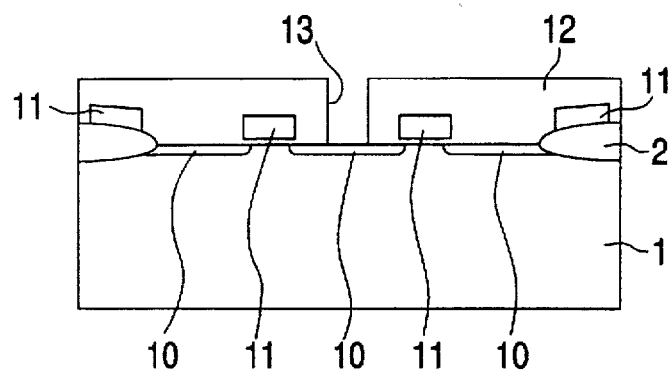
FIGS. 6A–6D are cross sectional views showing the manufacturing steps of the semiconductor device shown in FIG. 5.

A method of manufacturing the DRAM cell semiconductor device of the third embodiment having the above-described construction will now be explained also with reference to FIGS. 6A–6D. A device isolation oxide film 2 is formed on a semiconductor substrate 1 by the LOCOS method in the same manner as the conventional device is formed. Word lines 11 made of, e.g., a polycrystalline silicon film are formed. Then, arsenic ions, for example, are implanted into the semiconductor substrate 1 to form diffusion layers 10. A first interlayer insulation film 12 is deposited at a thickness of 6,000 Å by, e.g., CVD, and a desired portion of the first interlayer insulation film 1 is etched to the top surface of the diffusion layer 10 by photolithography, whereby the first contact hole 13 is formed (FIG. 6A).

Figure 6B:
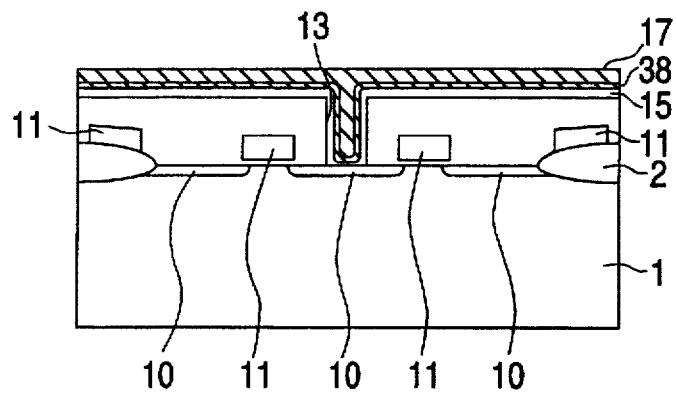
Figure 6C:
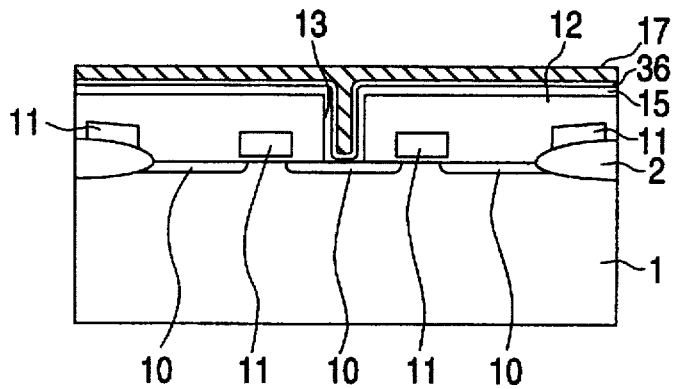

By using CVD, a polycrystalline silicon film 15 doped at $5\times10^{20}/cm^2$ with, for example, phosphorus as a dopant for determining the conductivity type, is formed at a thickness of, for example, 800 Å. A titanium film 38 is then formed at a thickness of, for example, 50 Å by sputtering, followed by formation of a tungsten silicide film 17 at a thickness of, for example, 800 Å, by sputtering (FIG. 6B). Subsequently, a heat treatment of RTA is carried out for 30 seconds at 700° C. to form a titanium silicide film 36 of the C54 structure by reacting the titanium film 38 with the polycrystalline silicon film 15 (FIG. 6C). At this time, a native oxide film of a few angstrom that exists on the polycrystalline silicon film 15 turns into TiO (titanium oxide) as a result of reducing action of titanium of the titanium film 38, and the thus-reduced substance is discharged into the atmosphere.

Figure 6D:
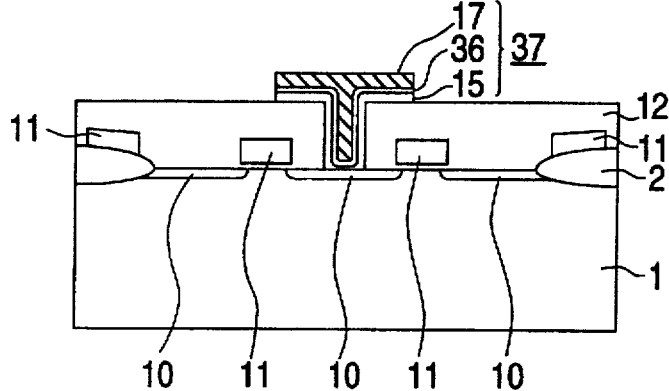

Next, the bit line 37 is formed by etching prescribed portions of the polycrystalline silicon film 15, the titanium silicide film 36 of the C54 structure, and the tungsten silicide film 17 using photolithography (FIG. 6D).

This is followed by formation of a second interlayer insulation film 18 at a thickness of 5,000 Å using, e.g., CVD. Second contact holes 19 are formed by etching prescribed portions of the first and second interlayer insulation films 12 and 18 to the top surface of the diffusion layers 10 by photolithography. Polycrystalline silicon doped with, e.g., phosphorous is deposited at a thickness of 5,000 Å, and storage nodes 21 are formed by patterning the polycrystalline silicon film. Capacitor insulation films 22 having a thickness of, for example, 100 Å are formed on the storage nodes 21, and a cell plate 23 having a thickness of 1,000 Å and made of, for example, a polycrystalline silicon film is formed thereon to constitute capacitors 20. Thus, a DRAM cell is completed (FIG. 5).

The semiconductor device of the third embodiment constructed as described above has the titanium silicide film 36 of the C54 structure that is formed between the polycrystalline silicon film 15 and the tungsten silicide film 17 in the same manner as in the embodiments described above. Therefore, for the same reasons as described in the above embodiments, the diffusion of, e.g., phosphorous as the dopant for determining the conductivity type contained in the polycrystalline silicon film 15 into the tungsten silicide film 17 is prevented by the titanium silicide film 36 of the C49 or C54 structure.

Therefore, the resistance increase of the polycrystalline silicon film 15 resulting from a drop in the phosphorus concentration of the polycrystalline silicon film 15 is suppressed, as a result of which it becomes possible to provide a semiconductor device, i.e., a DRAM cell, having only a small delay in signal reading.

Further, similarly to the embodiments described above, because a native oxide film existing on the top surface of the polycrystalline silicon film 15 is eliminated being reduced by titanium of the titanium film 38 that has strong reducing action when the titanium film 38 reacts with the polycrystalline silicon film 15. As a result, without a native oxide film having a large resistance, the bit line 37 is allowed to have a small resistance.

As in the above-mentioned embodiments, the resistivity of the titanium silicide film 36 of the C54 structure is about 15–30 μΩ·cm, which is smaller than about 25 Ω·cm of the titanium silicide film not having the C49 or C54 structure formed by the conventional sputtering method. Hence, this also contributes to formation of the bit line 32 having a small resistance.

Embodiment 4

Figure 7:
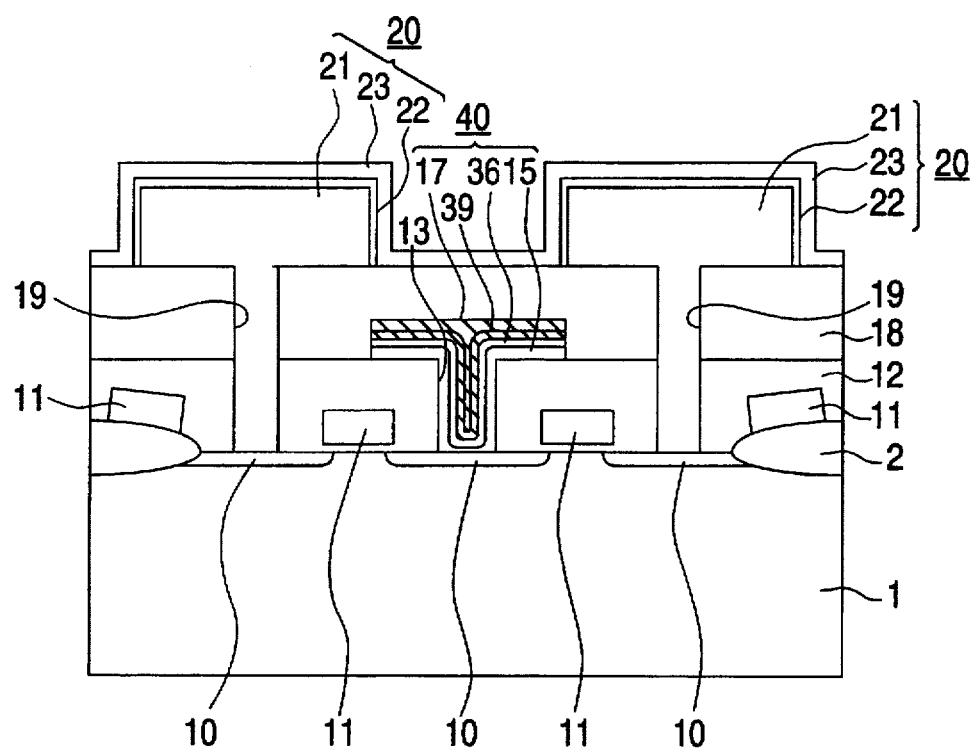
FIG. 7 is a cross sectional view showing the construction of a semiconductor device according to a fourth embodiment of the invention.

FIG. 7 is a cross sectional view showing the construction of an DRAM cell semiconductor device according to a fourth embodiment of the present invention. In the drawing, the same reference numerals are given to the corresponding elements in the conventional device, and hence the explanation thereof will be omitted here for brevity. Reference numeral 39 denotes a titanium nitride film formed between a titanium silicide film 36 of the C54 structure and a tungsten silicide film 17, and numeral 40 denotes a bit line so formed to fill a first contact hole 13. The bit line 13 comprises the polycrystalline silicon film 15 doped with, for example, phosphorous as a dopant for determining its conductivity type, the titanium silicide film 36 of the C54 structure, and the tungsten silicide film 17 which are stacked in the above order.

Figure 8A:
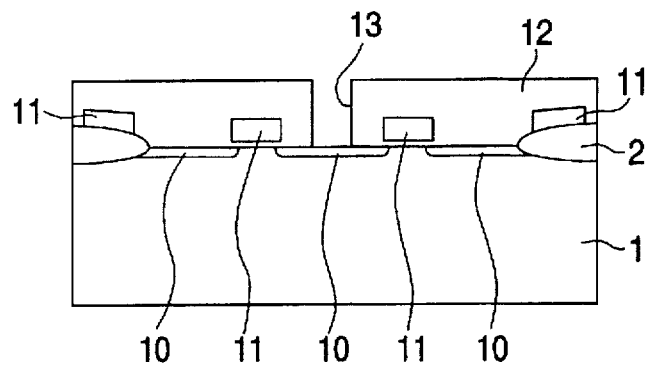
FIGS. 8A–8D are cross sectional views showing the manufacturing steps of the semiconductor device shown in FIG. 7.

A method of manufacturing the DRAM cell semiconductor device of the fourth embodiment having the above-described construction will now be explained also with reference to FIGS. 8A–8D. A device isolation oxide film 2 is formed on a semiconductor substrate 1 by the LOCOS method in the same manner as in the third embodiment. Word lines 11 made of, e.g., a polycrystalline silicon film are formed. Then, arsenic ions, for example, are implanted into the semiconductor substrate 1 to form the diffusion layers 10. A first interlayer insulation film 12 is deposited at a thickness of 6,000 Å by, e.g., CVD, and a desired portion of the first interlayer insulation film 1 is etched to the top surface of the diffusion layer 10 by photolithography, whereby a first contact hole 13 is formed (FIG. 8A).

Figure 8B:
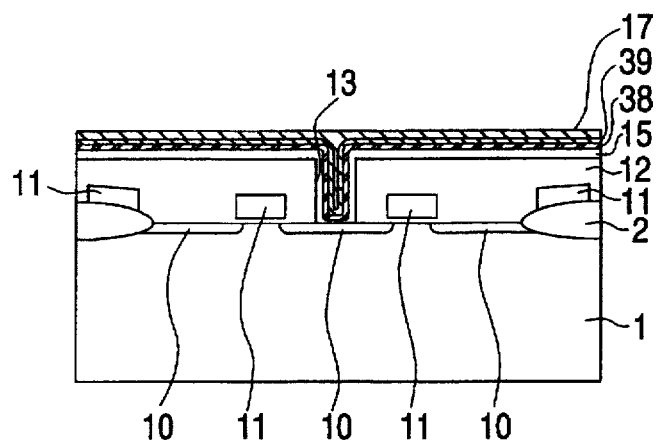
Figure 8C:
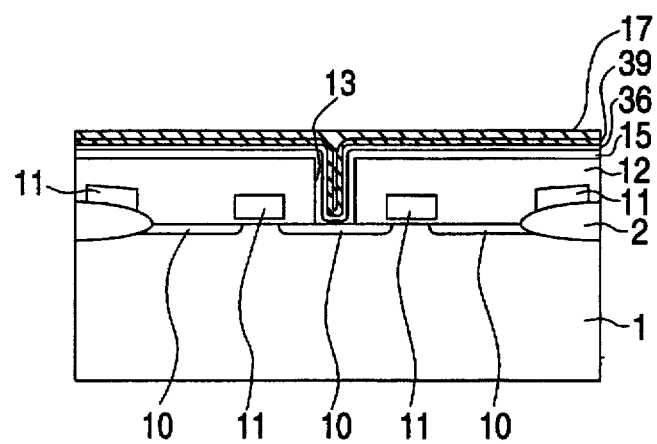

By using CVD, a polycrystalline silicon film 15 doped at $5\times10^{20}/cm^2$ with phosphorous, for example, as a dopant for determining its conductivity type, is formed at a thickness of, for example, 800 Å. A titanium film 38 is then formed at a thickness of, for example, 50 Å by sputtering, followed by formation of a titanium nitride film 39 at a thickness of, for example, 100 and a tungsten silicide film 17 at a thickness of, for example, 800 Å by sputtering (FIG. 8B). Subsequently, a heat treatment of RTA is carried out for 30 seconds at 700° C. to form a titanium silicide film 36 of the C54 structure by reacting the titanium film 38 with the polycrystalline silicon film 15 (FIG. 8C). At this time, a native oxide film of a few angstrom that exists on the polycrystalline silicon film 15 turns into TiO (titanium oxide) as a result of reducing action of titanium of the titanium film 38, and the thus-reduced substance is discharged into the atmosphere.

Figure 8D:
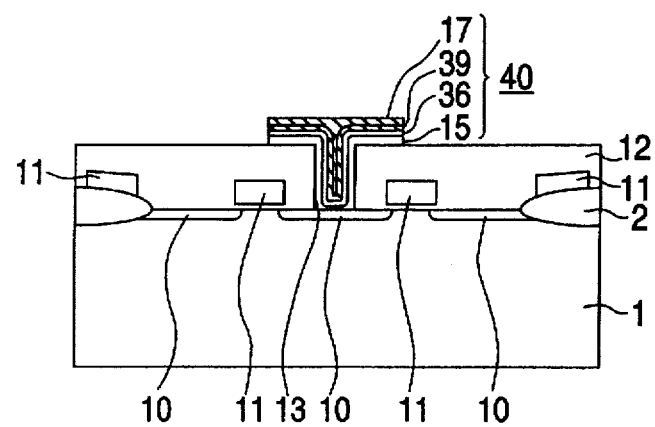

Next, the bit line 37 is formed by etching prescribed portions of the polycrystalline silicon film 15, the titanium silicide film 36 of the C54 structure, the titanium nitride film 39, and the tungsten silicide film 17 by using photolithography (FIG. 8D). This is followed by formation of a second interlayer insulation film 18 at a thickness of 5,000 Å by, e.g., CVD. A second contact hole 19 is then formed by etching desired portions of the first and second interlayer insulation films 12 and 18 to the top surface of the diffusion layers 10 by photolithography. Polycrystalline silicon doped with, e.g., phosphorous is deposited at a thickness of 5,000 Å, and storage nodes 21 are formed by patterning the polycrystalline silicon film. Capacitor insulation films 22 having a thickness of, for example, 100 Å are formed on the storage nodes 21, and a cell plate 23 having a thickness of 1,000 Å and made of, for example, a polycrystalline silicon film is formed thereon to constitute capacitors 20. Thus, a DRAM cell is completed (FIG. 7).

The semiconductor device of the fourth embodiment constructed as described above has the titanium silicide film 36 of the C54 structure that is formed between the polycrystalline silicon film 15 and the tungsten silicide film 17 in the same manner as in the embodiments described above. For this reason, this semiconductor device brings the same advantages as those obtained by the previous embodiments. Further, the titanium nitride film 39 is formed between the titanium silicide film 36 and the tungsten silicide film 17, and hence the diffusion of, e.g., phosphorous as the dopant for determining the conductivity type contained in the polycrystalline silicon film 15 into the tungsten silicide film 17 is prevented more effectively by the titanium nitride film 39.

Therefore, the resistance increase of the polycrystalline silicon film 15 resulting from a drop in the phosphorus concentration of the polycrystalline silicon film 15 is further suppressed, as a result of which it becomes possible to provide a semiconductor device, i.e., a DRAM cell, having a small delay of signal reading.

Embodiment 5

Figure 9:
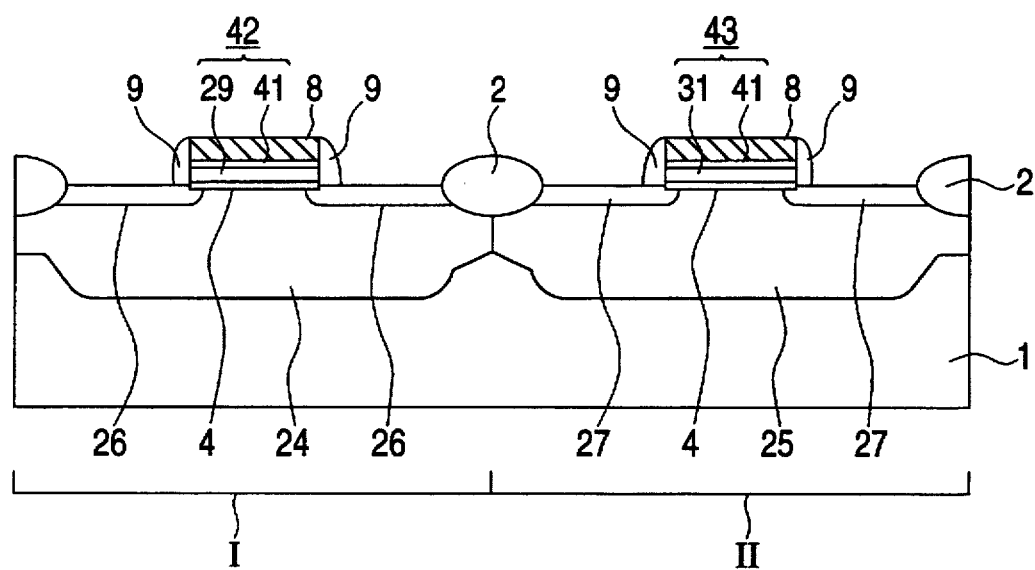
FIG. 9 is a cross sectional view showing the construction of a semiconductor device according to a fifth embodiment of the invention.

FIG. 9 is a cross sectional diagram showing the structure of a dual gate CMOS semiconductor device according to a fifth embodiment of the present invention. In the drawing, the parts that are the same as those in the above-mentioned prior art are assigned the same reference numerals, and the explanation thereof will be omitted. Numeral 41 denotes titanium silicide films of the C54 structure respectively formed between a tungsten silicide film 8 and an N-type polycrystalline silicon film 29 and between another tungsten silicide film 8 and a P-type polycrystalline silicon film 31. Numeral 42 denotes an NMOS gate electrode formed in an NMOS formation region I. The NMOS gate electrode 42 comprises the N-type polycrystalline silicon film 29 doped with, for example, arsenic as a dopant for determining a first conductivity type, the titanium silicide film 41 of the C54 structure, and the tungsten silicide film 8 which are stacked in the above order. Numeral 43 denotes a PMOS gate electrode formed in a PMOS formation region II. The PMOS gate electrode 43 comprises the P-type polycrystalline silicon film 31 doped with, for example, boron as a dopant for determining a second conductivity type, the titanium silicide film 41 of the C54 structure, and the tungsten silicide film 8 which are stacked in the above order.

A method of manufacturing the dual gate CMOS semiconductor device of the fifth embodiment will now be described also with reference to FIGS. 10A–10D. First of all, a device isolation oxide film 2 is formed on a semiconductor substrate 1 by the LOCOS method in the same manner as in the conventional device described above. A P well 24 is formed by forming an opening in a resist film only in the NMOS formation region I using photolithography, and implanting, for example, boron ions into the semiconductor substrate 1 while the energy of implantation is varied. An N well 25 is formed by forming an opening in a resist film only in the NMOS formation region II using photolithography, and implanting, for example, phosphorous ions while the energy for implantation is varied.

Figure 10A:
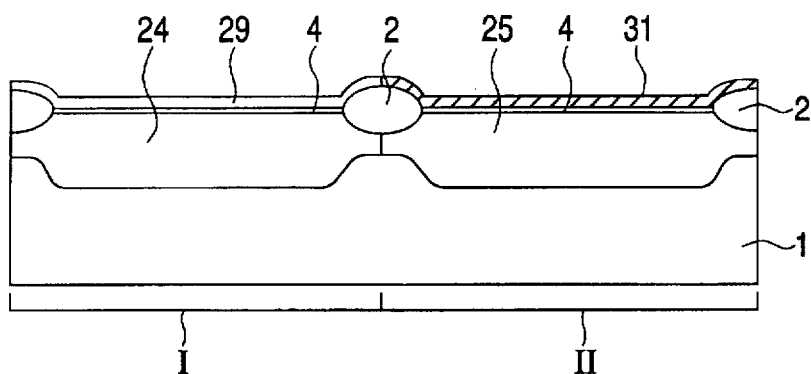
FIGS. 10A–10D are cross sectional views showing the manufacturing steps of the semiconductor device shown in FIG. 9.

A gate oxide film 4 is formed at a thickness of 60 Å by oxidizing the top surface of the semiconductor substrate 1 by, for example, thermal oxidation. A polycrystalline silicon film is then deposited at a thickness of 800 Å by, e.g., CVD. An N-type polycrystalline silicon film 29 is then formed by forming an opening in a resist film only above the P well 24 using photolithography, and implanting, for example, arsenic ions into the polycrystalline silicon film under the conditions of 30 keV and $4\times10^{15}/cm^2$. A P-type polycrystalline silicon film 31 is formed by forming an opening in a resist film only above the N well 25 using photolithography, and implanting, for example, boron ions into the polycrystalline silicon film under the conditions of 5 keV and $4\times10^{15}/cm^2$ (FIG. 10A).

Figure 10B:
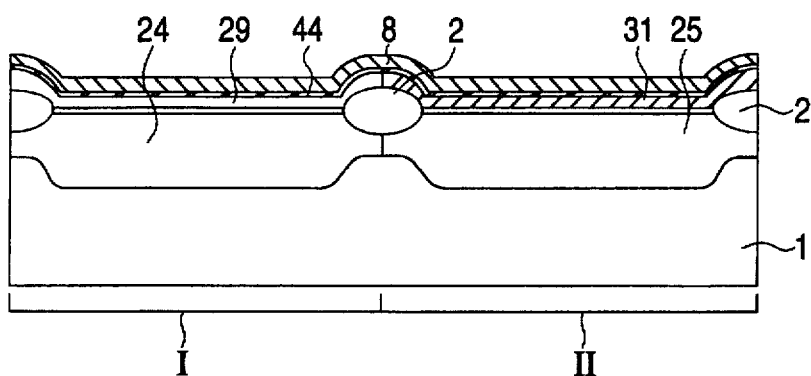
Figure 10C:
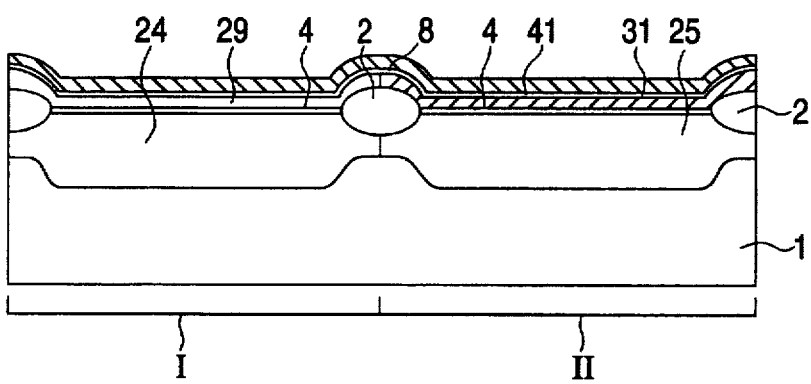

A titanium film 44 is deposited at a thickness of, for example, 50 Å by sputtering. A tungsten silicide film 8 is then deposited at a thickness of, for example, 800 Å, again by sputtering (FIG. 10B). The substrate is then subjected to a heat treatment of RTA for 30 seconds at a temperature of 700° C. to react the titanium film 44 with the N-type polycrystalline silicon film 29 and the P-type polycrystalline silicon film 31, to thereby form a titanium silicide film 41 of the C54 structure (FIG. 10C). At this time, a native oxide film of a few angstrom that exists on both polycrystalline silicon layers 29 and 31 turns into TiO (titanium oxide) as a result of reducing action of titanium of the titanium film 44, and the thus-reduced substance is discharged into the atmosphere.

Figure 10D:
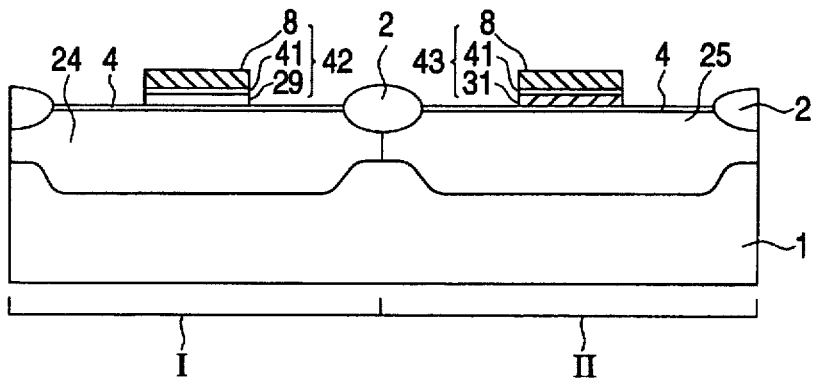

The NMOS and PMOS gate electrodes 42 and 43 are then formed by etching prescribed portions of the N-type and P-type polycrystalline silicon films 29 and 31, the titanium silicide film 41 of the C54 structure, and the tungsten silicide film 8 using photolithography (FIG. 10D). Then, by using photolithography, LDD layers are formed in the NMOS formation region I by implanting, for example, arsenic ions into the P well 24 under the conditions of 30 keV and $4\times10^{13}/cm^2$ while the semiconductor substrate 1 is tilted at 40°. A silicon oxide film is then deposited at a thickness of 800 Å by, e.g., CVD, and side-wall oxide films 9 are formed by etching back the thus-deposited silicon oxide film.

Thereafter, an opening is formed in a resist film only in the NMOS formation region I by using photolithography, and N-type source/drain regions 26 are formed by implanting, for example, arsenic ions into the P well 24 under the conditions of 50 keV and $4\times10^{15}/cm^2$. P-type source/drain regions 27 are then formed by forming an opening in a resist film only in the NMOS formation region II, and implanting, for example, boron ions into the N well 25 under the conditions of 10 keV and $4\times10^{15}/cm^2$. A heat treatment is performed at 800° C. for 60 minutes, to complete a dual gate CMOS device.

Figure 23:
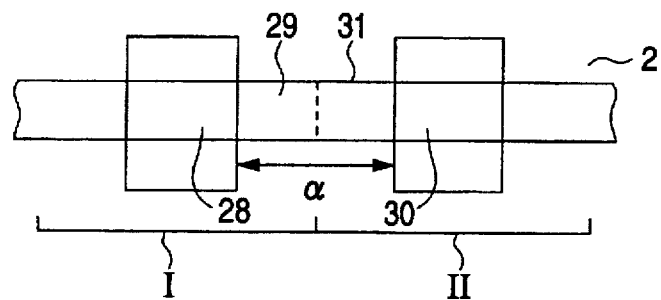
FIG. 23 is a top view illustrating a distance "d" between an NMOS formation region I and a PMOS formation region II in a dual gate CMOS.

The semiconductor device of the fifth embodiment constructed as described above has the titanium silicide film 41 of the C54 structure that is formed between the tungsten silicide films 8 and the N-type and P-type polycrystalline silicon films 29 and 31 in the same manner as in the embodiments described above. Hence, for the same reasons as described in the above embodiments, the diffusion of, for example, phosphorous and arsenic, as the dopants for determining the conductivity types contained in the respective polycrystalline silicon films 29 and 31 into the tungsten silicide film 8 is prevented by the titanium silicide film 41 of the C54 structure. Therefore, it goes without saying that similar advantages to those of the above embodiments are achieved. Further, the P-type and N-type dopants are prevented from diffusing to mix each other, so that the work functions of the gate electrode 42 and 43 do not vary. For this reason, the distance "d" between the NMOS formation region I and the PMOS formation region II, as shown in FIG. 23 used above in describing the prior art, can be made smaller, which enables manufacture of a miniaturized dual gate CMOS semiconductor device.

Embodiment 6

In the fifth embodiment, the NMOS and PMOS gate electrodes 42 and 43 are formed by the N-type or P-type polycrystalline silicon films 29 and 31, the titanium silicide film 41 of the C54 structure, and the tungsten silicide film 8 which are stacked in the above order. However, if the NMOS and PMOS gate electrodes are formed by the N-type or P-type polycrystalline silicon film, the titanium silicide film of the C54 structure, a titanium nitride film, and the tungsten silicide film which are stacked in the above order, not only the titanium silicide film of the C54 structure but also the titanium nitride film prevents the dopants for determining conductivity types of the respective polycrystalline silicon films from diffusing into the tungsten silicide film. Therefore, the P-type and N-type dopants is more effectively prevented from diffusing to mix each other, and the work functions of the respective gate electrodes is certainly ensured to remain unchanged. For these reasons, the distance "d" between the NMOS formation region I and the PMOS formation region II can be made further smaller, which in turn obviously means that the device can be miniaturized to a larger extent.

Embodiment 7

Figure 11:
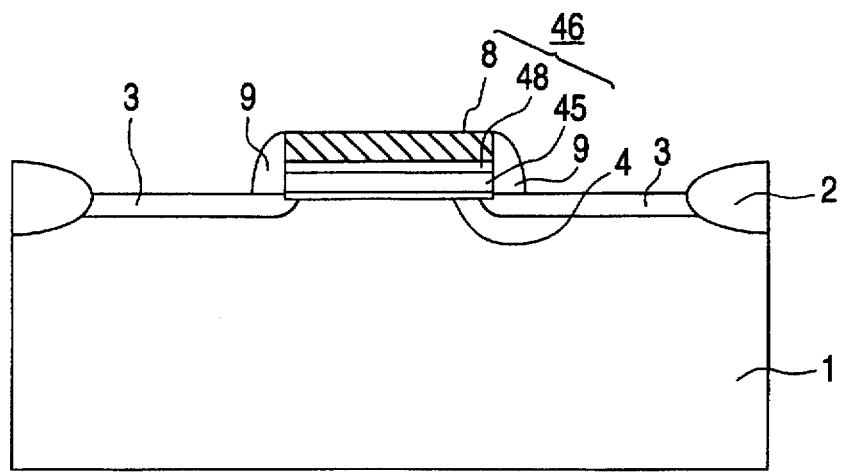
FIG. 11 is a cross sectional view showing the construction of a semiconductor device according to a seventh embodiment of the invention.

FIG. 11 is a cross sectional view showing the structure of a semiconductor device, i.e., an NMOS transistor, according to a seventh embodiment of the present invention. In the drawing, parts that are the same as those in the first embodiment are assigned the same reference numerals, and the explanation thereof will be omitted. Reference numeral 45 denotes a polycrystalline silicon film containing, for example, phosphorous and nitrogen as dopants for determining its conductivity type, and numeral 46 denotes a gate electrode comprising the polycrystalline silicon film 45, a titanium silicide film 48 of the C54 structure, and a tungsten silicide film 8 which are stacked in the above order.

Figure 12A:
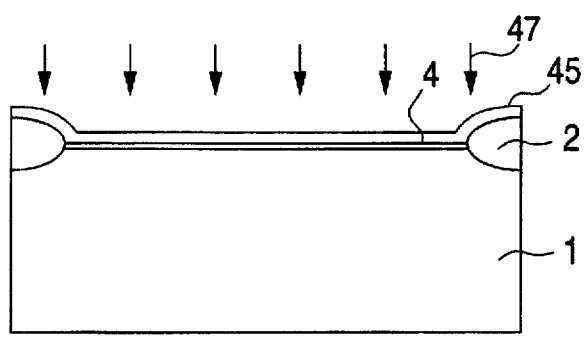
FIGS. 12A–12D are cross sectional views showing the manufacturing steps of the semiconductor device shown in FIG. 11.

A method of manufacturing the semiconductor device (NMOS transistor) of the seventh embodiment having the above described construction will be described in conjunction with FIGS. 12A–12D. First, similarly to the first embodiment, a device isolation oxide film 2 is formed on a semiconductor substrate 1 by the LOCOS method. A gate oxide film 4 is then formed at a thickness of 60 Å by oxidizing the top surface of the semiconductor substrate 1 by thermal oxidation. By using CVD, a polycrystalline silicon film doped at $5\times10^{20}/cm^2$ with phosphorous, for example, as a dopant for determining its conductivity type is deposited at a thickness of, for example, 800 Å. A polycrystalline silicon film 45 containing phosphorous and nitrogen is formed by implanting nitrogen ions 47 into the polycrystalline silicon film under the conditions of, for example, 5 keV and $4\times10^{15}/cm^2$ (FIG. 12A).

Figure 12B:
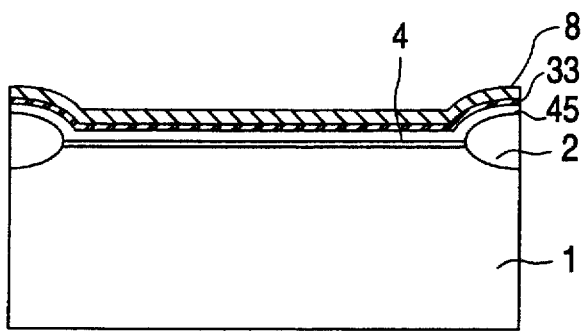
Figure 12C:
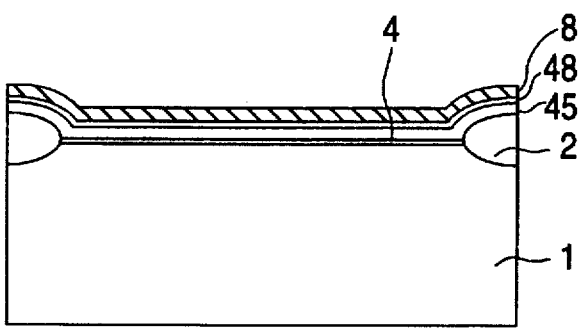

A titanium film 33 is then formed at a thickness of, for example, 50 Å by sputtering, followed by formation of a tungsten silicide film 8 at a thickness of, for example, 800 Å also by sputtering (FIG. 12B). The substrate is then subjected to a heat treatment of RTA for 30 seconds at a temperature of 700° C. to form a titanium silicide film 48 of the C54 structure by reacting the titanium film 33 with the polycrystalline silicon film 45 (FIG. 12C). At this time, a native oxide film of a few angstrom that exists on the polycrystalline silicon layer 6 turns into TiO (titanium oxide) as a result of reducing action of titanium of the titanium film 33, and the thus-reduced substance is discharged into the atmosphere.

Figure 12D:
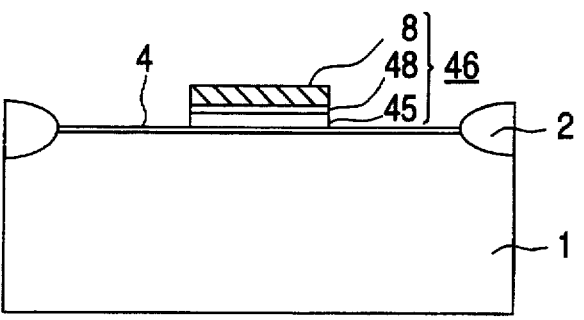

The gate electrode 46 is then formed by etching prescribed portions of the tungsten silicide film 8, the titanium silicide film 48 of the C54 structure, and the polycrystalline silicon film 45 by using photolithography (FIG. 12D). LDD layers are formed by implanting arsenic ions, for example, into the semiconductor substrate 1 under the conditions of 30 keV and $4.0\times10^{13}/cm^2$ while the semiconductor substrate 1 is tilted at, for example, 40°. A silicon oxide film is deposited at a thickness of 800 Å by, e.g., CVD, and side-wall oxide films 9 are formed by etching back the thus-deposited silicon oxide film. Arsenic ions, for instance, are the implanted into the semiconductor substrate 1 under the conditions of 50 keV and $4.0\times10^{15}/cm^2$, whereby source/drain regions 3 are formed. An NMOS transistor is completed by subjecting the substrate to a heat treatment of, for instance, 800° C. and 60 minutes (FIG. 11).

The semiconductor device of the seventh embodiment constructed as described above has the titanium silicide film 48 of the C54 structure that is formed between the polycrystalline silicon film 45 and the tungsten silicide film 8 as in the previous embodiments. Therefore, it goes without saying that similar advantages to those obtained in the above-described embodiments can be attained. The diffusion coefficient of nitrogen in the polycrystalline silicon film 45 is much different from that of phosphorous. For this reason, when both nitrogen and phosphorous diffuse at the same time, their effective diffusion coefficients are reduced, so that the diffusion of phosphorous is suppressed. As a result, the formation of a depletion layer across the interface between the gate electrode 46 and the gate oxide film 4 is further suppressed, allowing production of an NMOS transistor having a higher drive capability.

Although in the seventh embodiment the explanation was given of the case where the dopant for determining the conductivity type of the polycrystalline silicon film 45 is phosphorous, the dopant is not limited to phosphorous. Even if boron, arsenic, etc. are used as the dopant for determining the conductivity type, since their diffusion coefficients are a little different from that of nitrogen, naturally the same advantages will be achieved.

Although in seventh embodiment only the titanium silicide film 48 of the C54 structure is formed between the polycrystalline silicon film 45 and the tungsten silicide film 8, the invention is not limited to such a case. If a titanium nitride film is formed between the titanium silicide film 48 of the C54 structure and the tungsten silicide film 8 as in the above-described embodiments, the same advantages will naturally be realized.

In the seventh embodiment, explanation was given of the NMOS transistor. However, the present invention is not limited to such a case. If the bit line or each of the polycrystalline silicon films of the dual gate CMOS device is provided with nitrogen as in the seventh embodiment, the diffusion of the dopant for determining the conductivity type of the polycrystalline silicon film will be suppressed by the introduction of nitrogen. Therefore, in the case of the bit line, the resistance increase of the polycrystalline silicon film is further suppressed, which makes it is possible to reduce a delay in signal reading more effectively. Further, in the dual gate CMOS device, the N-type and P-type dopants are more effectively prevented from diffusing to mix each other, and the work functions of the NMOS and PMOS gate electrodes are ensured not to vary, which allows the device to be miniaturized to a greater extent.

Each of the above embodiments is directed to the case of forming the titanium silicide film of the C54 structure. As described previously, the particle size of the titanium silicide film of the C54 structure is as large as 2–3 μm. It goes without saying that if the width of the wiring layer using the titanium silicide film of the C54 structure and the thickness of the titanium silicide film of the C54 structure are greater than this particle size, the titanium silicide film of the C54 structure can be formed more easily. Where the width of the wiring layer and the thickness of the titanium silicide film of the C54 structure are smaller than the above particle size, a titanium silicide film of the C49 structure and the titanium silicide film composed of a mixed crystal of the C54 and C49 structures are occasionally formed.

Embodiment 8

Although each of the above embodiments is directed to the case of using the titanium silicide film of the C54 structure, the invention is not limited to such a case, but the titanium silicide film of the C49 structure can also be used. Even if the titanium silicide film of the C49 structure is used, the same advantages as obtained in the previous embodiments will be ensured, because the titanium silicide film of the C49 structure provides similar results for the characteristics of FIGS. 13–16 which were described above in connection with the first embodiment.

In the following, only the differences between the titanium silicide film of the C49 structure and the titanium silicide film of the C54 structure will be explained. The titanium silicide film of the C49 structure has a body-centered rhombic crystal structure in which the lattice coefficients are a=0.362 nm, b=1.376 nm, and c=0.361 nm. The particle size is approximately 1.0 μm, and is slightly smaller than the that of the titanium silicide film of the C54 structure. However, with respect to the capability to prevent the diffusion of the dopant for determining the conductivity type, the titanium silicide film of the C49 structure is no different from the titanium silicide film of the C54 structure. The resistivity is as low as 100–200 μΩ·cm.

Further, as in the case of the titanium silicide film of the C54 structure, the titanium silicide film of the C49 structure is formed by reacting a titanium film with a polycrystalline silicon film by using RTA. However, to form the titanium silicide film of the C49 structure, RTA conditions of 500° C. and 30 seconds are employed.

If the titanium silicide film of the C49 structure is subjected to a heat treatment at more than 500° C. in some of various later heat treatment steps, there may occur partial transition from the C49 structure to the C54 structure, in which case the titanium silicide film comes to be made of a mixed crystal of the C54 and C49 structures. Further, if the titanium silicide film of the C49 structure is subjected to a heat treatment at a temperature of 700° C., the titanium silicide film of the C49 structure turns into the titanium silicide film of the C54 structure. However, the particle size of the titanium silicide film of the C54 structure is larger than that of the titanium silicide film of the C49 structure. Hence, in a wiring line smaller than the particle size of the C54 structure, the titanium silicide film of the C49 structure is less likely to turn into the titanium silicide film of the C54 structure, so that the titanium silicide film of the C49 structure remains intact.

Embodiment 9

Even if the titanium silicide film made of a mixed crystal of the C54 and C49 structures is used instead of the titanium silicide film of the C54 structure, the same advantages as obtained in the previous embodiments will be ensured, because the titanium silicide film made of a mixed crystal of the C54 and C49 structures provides similar results for the characteristics of FIGS. 13–16 which were described above in connection with the first embodiment. In the following, differences in the methods for forming the titanium silicide film made of a mixed crystal of the C49 and C54 structures, the titanium silicide film of the C54 structure, and the titanium silicide film of the C49 structure will be explained. To form the titanium silicide film made of a mixed crystal of the C54 and C49 structures, RTA is performed to react a titanium film with a polycrystalline silicon film as in the case of forming the titanium silicide film of the C54 structure. However, RTA conditions of 500°–700° C. and 30 seconds are employed.

Embodiments 10

The above embodiments are directed to the NMOS transistor, the bit line, and the dual gate CMOS device. However, the present invention is not limited to those cases, but, needless to say, can be applied to all of wiring layers including a polycrystalline silicon film containing a dopant for determining its conductivity type and a tungsten silicide film.

Embodiments 11

Although in the above embodiments the polycrystalline silicon film is used as an example of the non-single-crystal silicon film, the invention is not limited to such a case, but, needless to say, an amorphous silicon film, for instance, can also be used.

Embodiments 12

Although in the above embodiments the tungsten silicide film is used as an example of the metal silicide film, the invention is not limited to such a case, but, needless to say, a molybdenum silicide film, for instance, can also be used.

Embodiments 13

In each of the above embodiments, the thickness of the titanium silicide film of the C49 or C54 structure has not been specifically described. If this film is formed at a thickness of not less than 20 Å, the dopant diffusion can be prevented positively. To form the titanium silicide film of the C49 or C54 structure at a thickness of not less than 20 Å, it is necessary to form a titanium film having a thickness of not less than 10 Å for reaction with a polycrystalline silicon film.

What is claimed is:

1. A semiconductor device comprising: a wiring layer that includes a non-single-crystal silicon film containing a dopant for determining a conductivity type of the non-single-crystal silicon film; a titanium silicide film of a C49 and/or C54 structure as a dopant barrier layer; and a metal silicide film, other than titanium silicide, all of which films are substantially laid one on another so that the pattern edges match each other, wherein the titanium silicide film comprises titanium silicide obtained by reaction of a titanium layer with silicon in the non-single-crystal silicon film accompanied with reducing reaction of a native oxide layer on the non-single-crystal silicon film, forming a first interface between the non-single-crystal silicon film and the titanium silicide film, and a second interface between the metal silicide film and the titanium silicide film which are substantially free of a native oxide film.

2. The semiconductor device according to claim 1, wherein the wiring layer further includes a titanium nitride film between the titanium silicide film and the metal silicide film.

3. A dual gate CMOS semiconductor device comprising:

a first gate electrode including a first non-single-crystal silicon film containing a first dopant for determining a conductivity type of the first non-single-crystal silicon film, a first titanium silicide film of a C49 and/or C54 structure, and a first metal silicide film, other than titanium silicide, all of which films are substantially laid one on another; and a second gate electrode including a second non-single-crystal silicon film containing a second dopant for determining a conductivity type of the second non-single-crystal silicon film, a second titanium silicide film of the C49 and/or C54 structure as a dopant barrier layer; and a second metal silicide film, other than titanium silicide, all of which films are substantially laid one on another so that the pattern edges match each other wherein, both the first and second titanium silicide film comprise titanium silicide obtained by reaction of a titanium layer with silicon in the non-single-crystal silicon film accompanied with reducing reaction of a native oxide layer on each of the first and second non-single-crystal silicon films, forming a first interface between each of the first and second non-single-crystal silicon films and the titanium silicide film, and a second interface between each of the metal silicide films and the titanium silicide film which are substantially free of a native oxide film.

4. The semiconductor device according to claim 3, wherein the first gate electrode further includes a first titanium nitride film between the first titanium silicide film and the first metal silicide film, and the second gate electrode further includes a second titanium nitride film between the second titanium silicide film and the second metal silicide film.

5. The semiconductor device according to claim 1, wherein the non-single-crystal silicon film further contains nitrogen.

6. The semiconductor device according to claim 2, wherein the non-single-crystal silicon film further contains nitrogen.

7. The semiconductor device according to claim 3, wherein the non-single-crystal silicon film further contains nitrogen.

8. The semiconductor device according to claim 4, wherein the non-single-crystal silicon film further contains nitrogen.

9. The semiconductor device according to claim 2, wherein the metal silicide film, titanium nitride film and titanium silicide film have substantially the same shape in the vertical and horizontal directions.

10. The semiconductor device according to claim 4, wherein the first metal silicide film, first titanium nitride film and first titanium silicide film have essentially the same shape in the horizontal and vertical directions, and the second metal silicide film, second titanium nitride film and second titanium silicide film have essentially same shape in the vertical and horizontal directions.

11. A semiconductor device comprising source/drain region and a gate electrode formed on a gate oxide film on a substrate, the gate electrode that includes a non-single-crystal silicon film containing a dopant for determining a conductivity type of the non-single-crystal silicon film, a titanium silicide film of a C49 and/or C54 structure as a dopant barrier layer, and a metal silicide film, other than titanium silicide, all of which films are substantially laid one on another so that the pattern edges match each other, wherein the titanium silicide film comprises the titanium silicide obtained by reaction of a titanium layer with silicon in the non-single-crystal silicon film accompanied with reducing reaction of a native oxide layer formed on the non-single-crystal silicon film, forming a first interface between the non-single-crystal silicon film and the titanium silicide film, and a second interface between the metal silicide film and the titanium silicide film which are free from a native oxide film.

12. The semiconductor device according to claim 11, wherein the gate electrode further includes a titanium nitride film between the titanium silicide film and the metal silicide film.

* * * * *